(12) United States Patent
Kim et al.

(10) Patent No.: US 10,375,227 B2
(45) Date of Patent: Aug. 6, 2019

(54) MOBILE TERMINAL

(71) Applicant: LG ELECTRONICS INC., Seoul (KR)

(72) Inventors: Byungki Kim, Seoul (KR); Haengchul Kwak, Seoul (KR); Hangshin Cho, Seoul (KR); Dongchul Jin, Seoul (KR); Eunmo Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 4 days.

(21) Appl. No.: 15/578,968

(22) PCT Filed: Jan. 29, 2016

(86) PCT No.: PCT/KR2016/000971
§ 371 (c)(1),
(2) Date: Dec. 1, 2017

(87) PCT Pub. No.: WO2016/195207
PCT Pub. Date: Dec. 8, 2016

(65) Prior Publication Data
US 2018/0139323 A1 May 17, 2018

(30) Foreign Application Priority Data
Jun. 4, 2015 (KR) .................. 10-2015-0079047

(51) Int. Cl.
*H04B 5/00* (2006.01)
*H04M 1/725* (2006.01)
(Continued)

(52) U.S. Cl.
CPC ........ *H04M 1/72569* (2013.01); *G06F 3/041* (2013.01); *G06F 3/044* (2013.01);
(Continued)

(58) Field of Classification Search
CPC ... H04M 1/72569; H04M 1/7258; H04M 1/22
(Continued)

(56) References Cited

U.S. PATENT DOCUMENTS 9,612,664 B2 * 4/2017 Croisonnier ............ G06F 3/017
9,638,731 B2 * 5/2017 Hu .......................... G06F 3/044
(Continued)

FOREIGN PATENT DOCUMENTS

EP 2657816 A2 10/2013
EP 2683140 A2 1/2014
(Continued)

*Primary Examiner* — April G Gonzales
(74) *Attorney, Agent, or Firm* — Birch, Stewart, Kolasch & Birch, LLP

(57) ABSTRACT

A mobile terminal is disclosed. The mobile terminal comprises: a case; an input module installed at the case, the input module acquiring a touch input of a user; and a controller generating a control signal, wherein the input module includes: a button having a plurality of holes, the plurality of holes located on the case; a capacitive sensor located in the case, the capacitive sensor acquiring a variation of a electrostatic capacitance in accordance with the touch input; and a dielectric layer located between the button and the capacitive sensor; wherein the electrostatic capacitance includes: a first electrostatic capacitance generated between the user and the capacitive sensor through the plurality of holes; and a second electrostatic capacitance generated between the button and the capacitive sensor, and wherein the controller generates the control signal when the capacitive sensor acquires the variations of the first and second electrostatic capacitances.

18 Claims, 33 Drawing Sheets

(51) Int. Cl.
    *G06F 3/041* (2006.01)
    *G06F 3/044* (2006.01)
    *H03K 17/96* (2006.01)
    *H04M 1/02* (2006.01)
    *H04M 1/22* (2006.01)

(52) U.S. Cl.
    CPC ........... *G06F 3/0416* (2013.01); *H03K 17/96* (2013.01); *H04M 1/02* (2013.01); *H04M 1/7258* (2013.01); *H04M 1/22* (2013.01)

(58) Field of Classification Search
    USPC ....................................................... 455/575.1
    See application file for complete search history.

(56) References Cited

U.S. PATENT DOCUMENTS

| | | | | |
|---|---|---|---|---|
| 9,664,555 | B2* | 5/2017 | Shiu | G01J 1/0271 |
| 9,772,245 | B2* | 9/2017 | Besling | G01L 9/0073 |
| 2006/0070449 | A1* | 4/2006 | Yokoyama | G01L 9/0073 |
| | | | | 73/754 |
| 2006/0232559 | A1* | 10/2006 | Chien | G06F 3/044 |
| | | | | 345/168 |
| 2008/0297176 | A1* | 12/2008 | Douglas | H03K 17/955 |
| | | | | 324/686 |
| 2009/0179860 | A1* | 7/2009 | Wang | G06F 3/0234 |
| | | | | 345/168 |
| 2011/0027128 | A1* | 2/2011 | Gridelet | G01N 33/5438 |
| | | | | 422/82.01 |
| 2011/0232976 | A1* | 9/2011 | Osoinach | G06F 3/0418 |
| | | | | 178/18.06 |
| 2013/0181935 | A1* | 7/2013 | McKenzie | G06F 3/044 |
| | | | | 345/174 |
| 2014/0166867 | A1* | 6/2014 | Shiu | G01J 1/0271 |
| | | | | 250/239 |
| 2014/0354305 | A1* | 12/2014 | Hanssen | H03K 17/9622 |
| | | | | 324/661 |
| 2015/0072742 | A1* | 3/2015 | Alameh | G01J 1/0407 |
| | | | | 455/575.1 |

FOREIGN PATENT DOCUMENTS

| | | |
|---|---|---|
| EP | 2765760 A1 | 8/2014 |
| KR | 10-2010-0001918 A | 1/2010 |
| KR | 10-2015-0011254 A | 1/2015 |
| KR | 10-2015-0049574 A | 5/2015 |

* cited by examiner

[Figure 1]
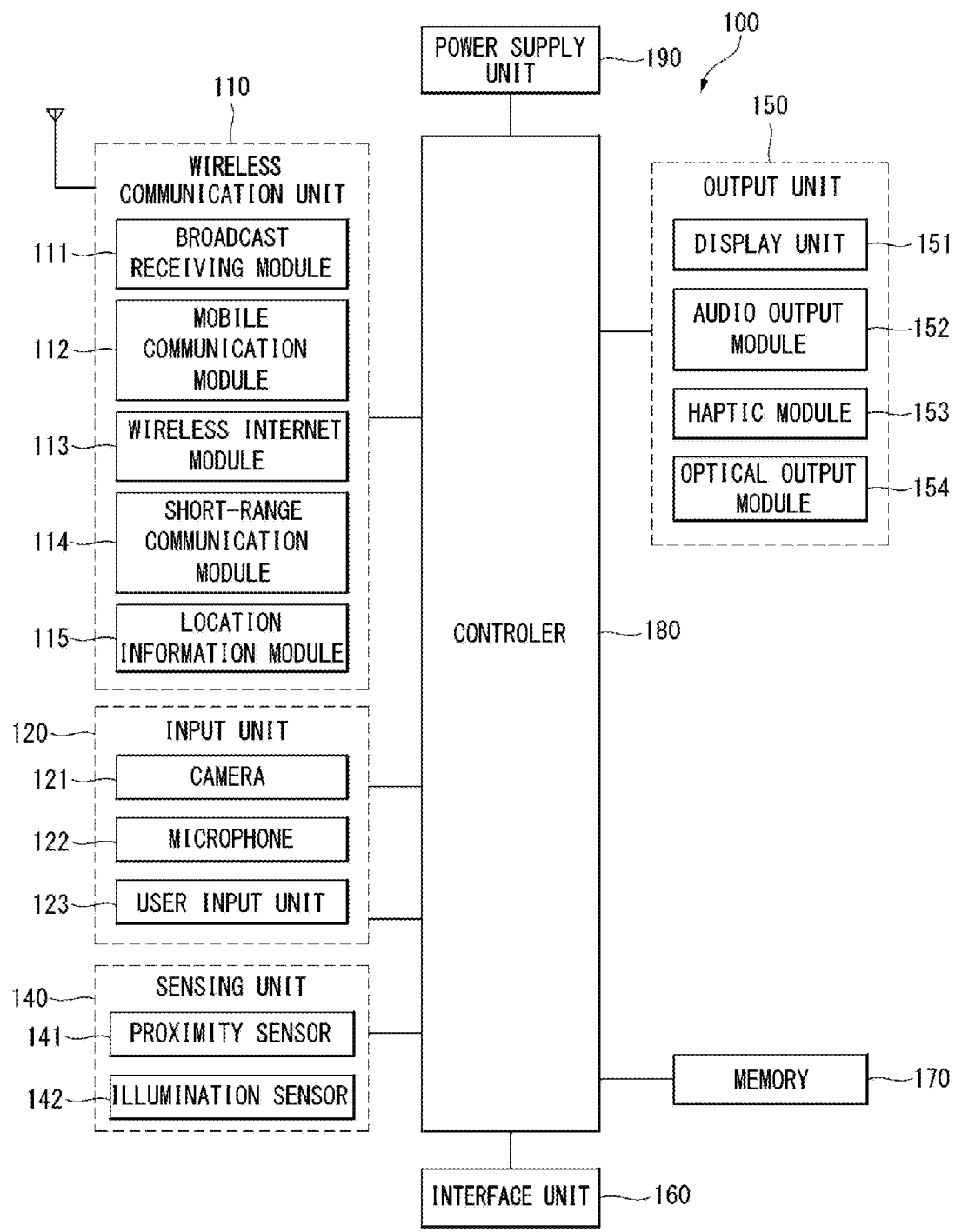

[Figure 2]
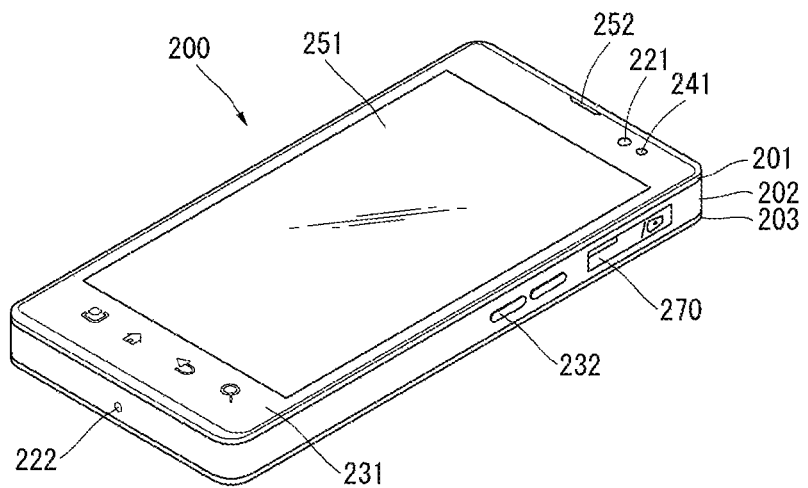

[Figure 3]
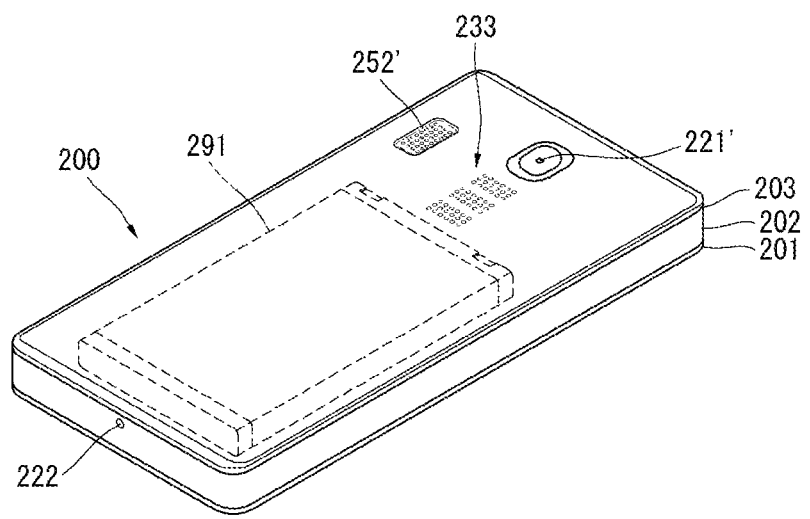

[Figure 4]
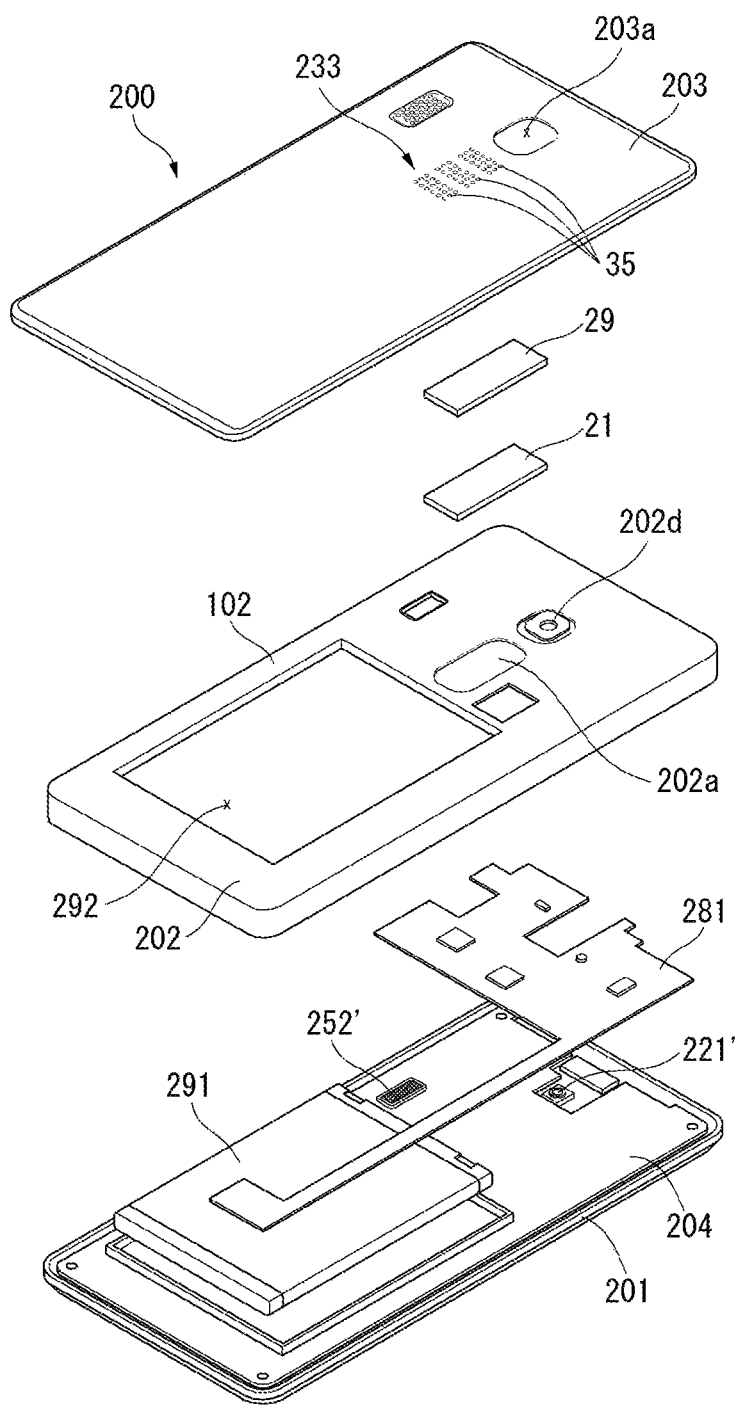

[Figure 5]
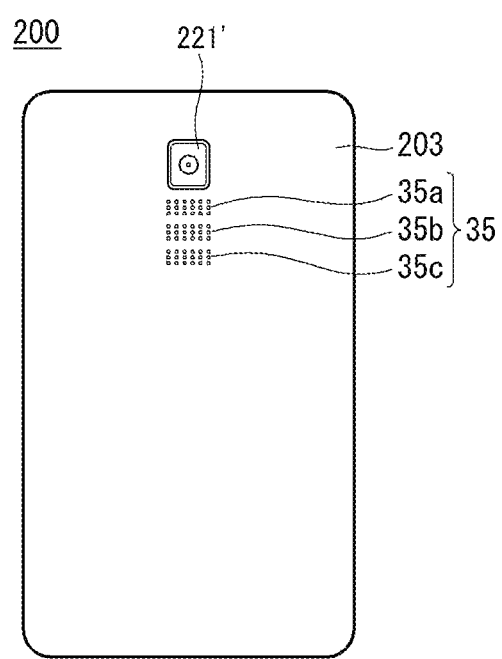

[Figure 6]
(a) 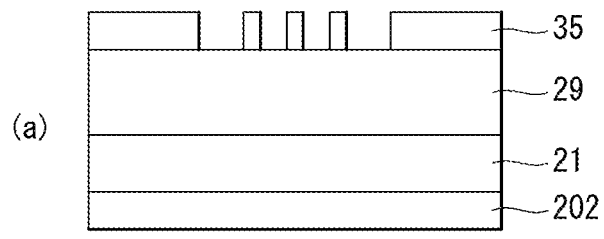
(b) 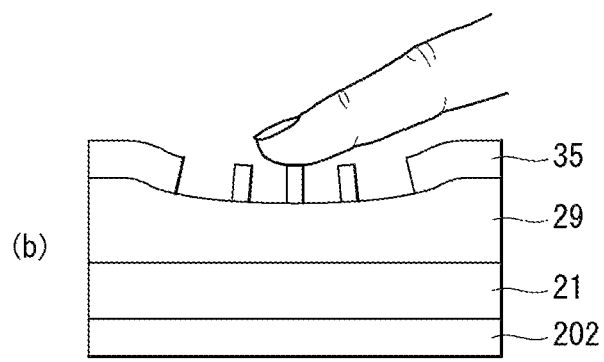

[Figure 7]
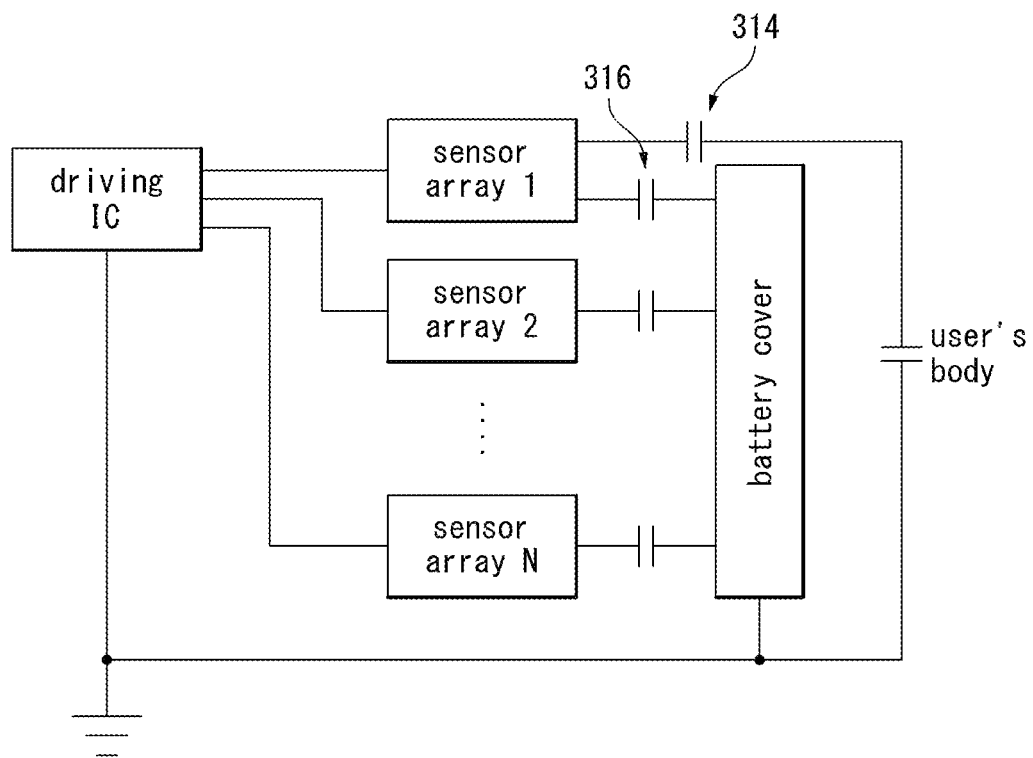

[Figure 8]
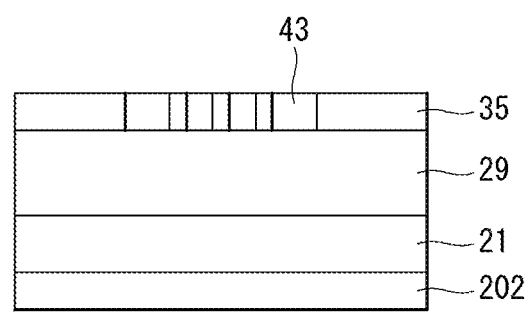

[Figure 9]
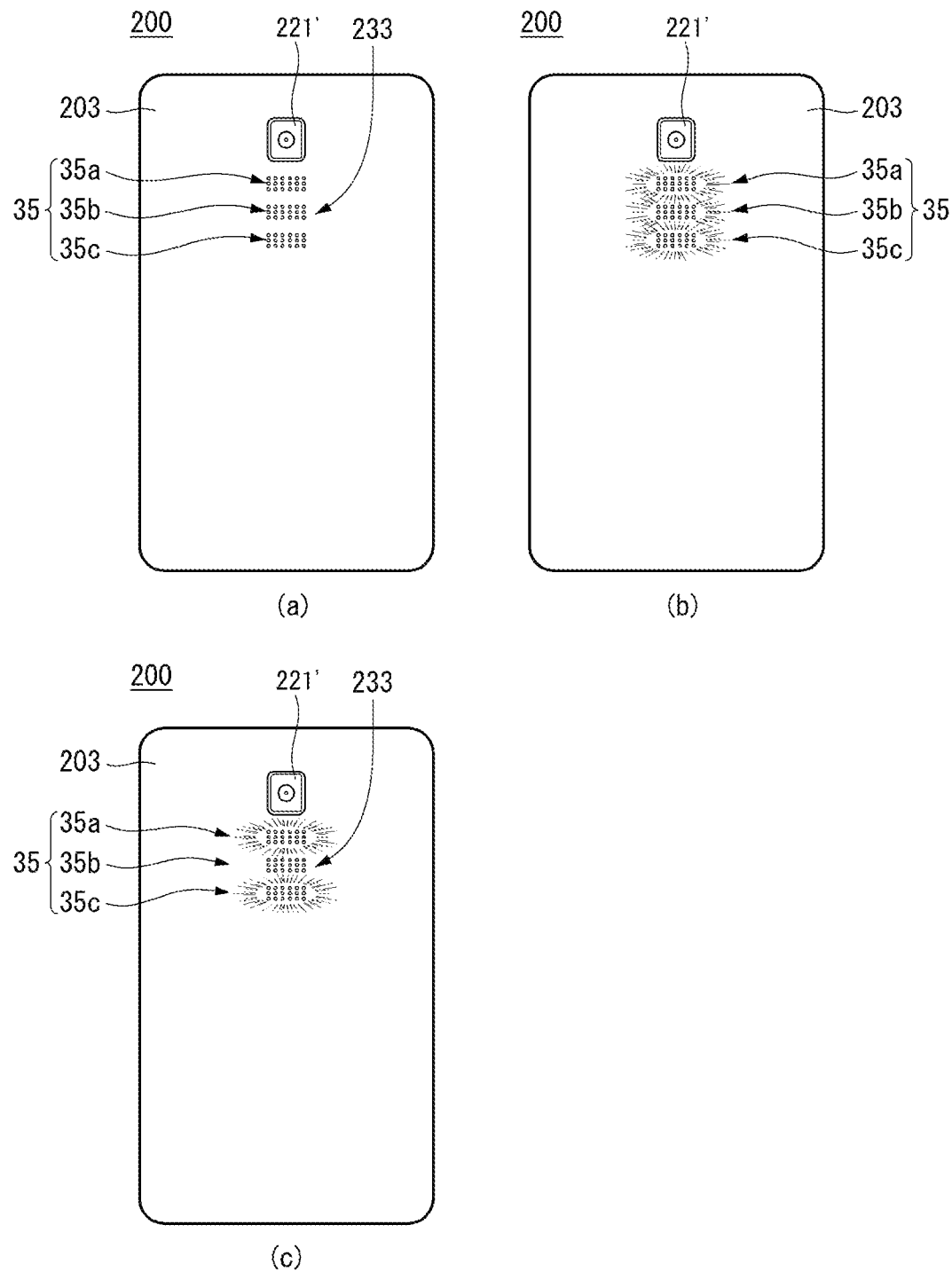

[Figure 10]
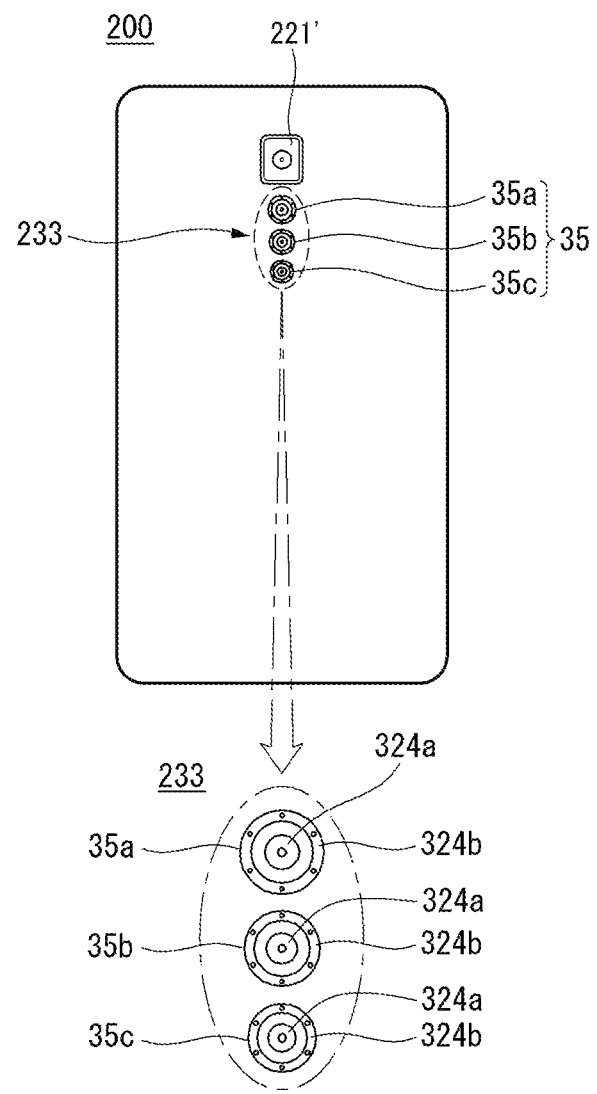

【Figure 11】
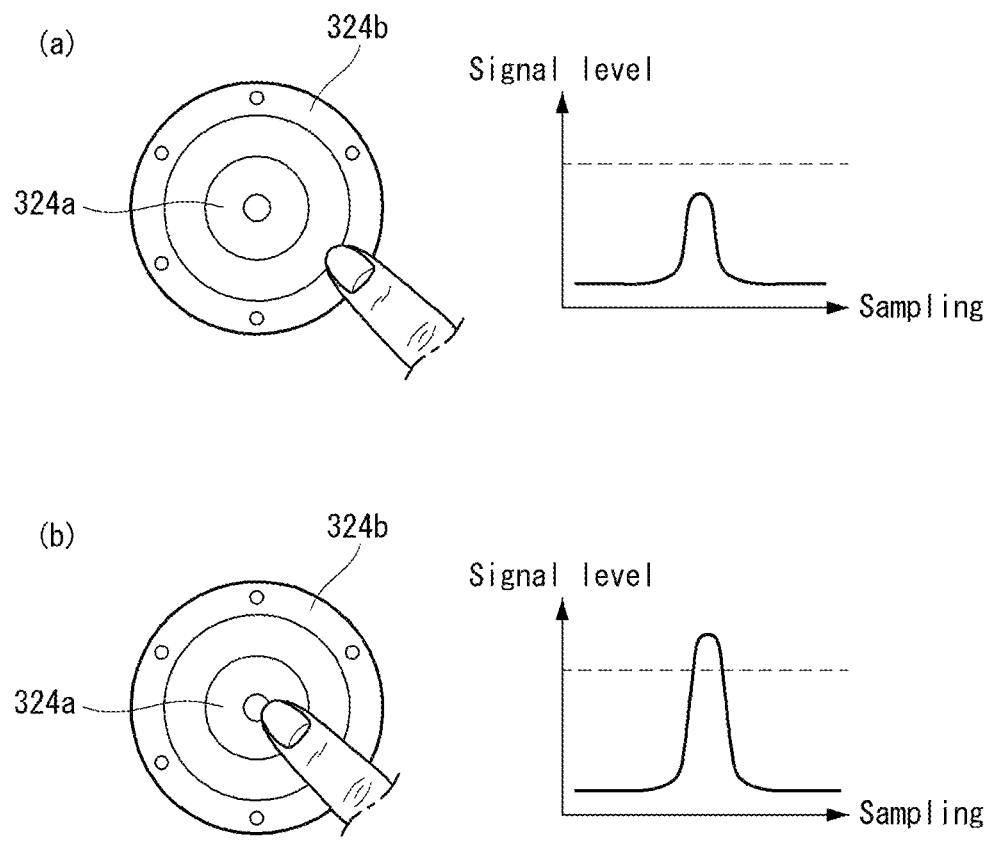

[Figure 12]
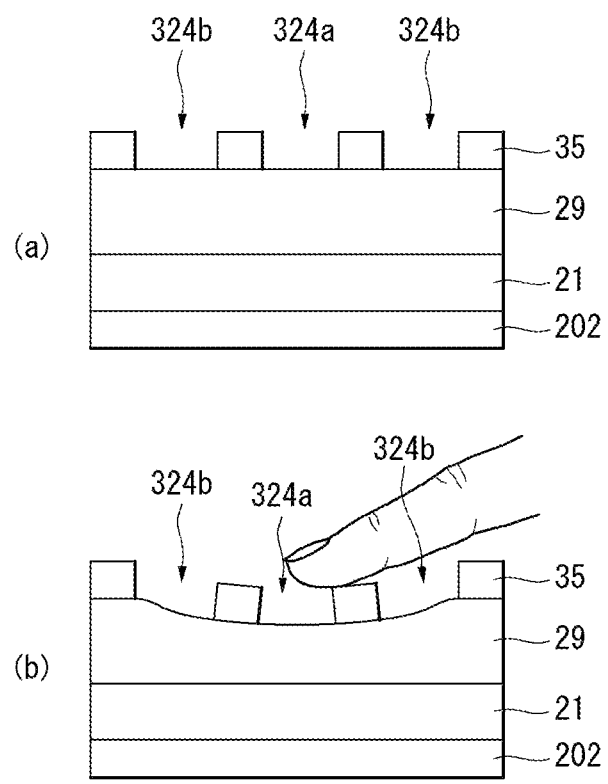

[Figure 13]
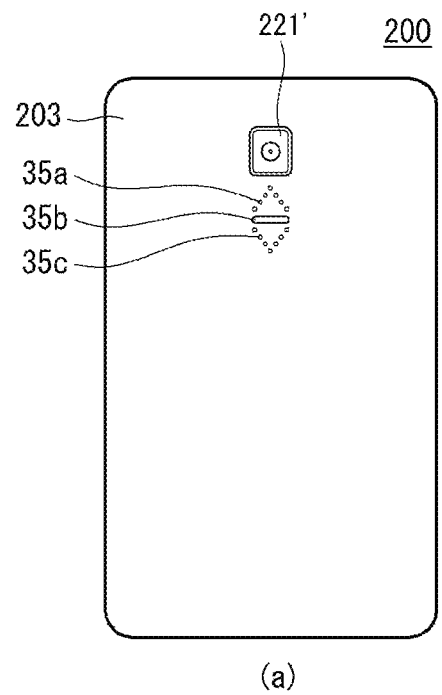
(a)
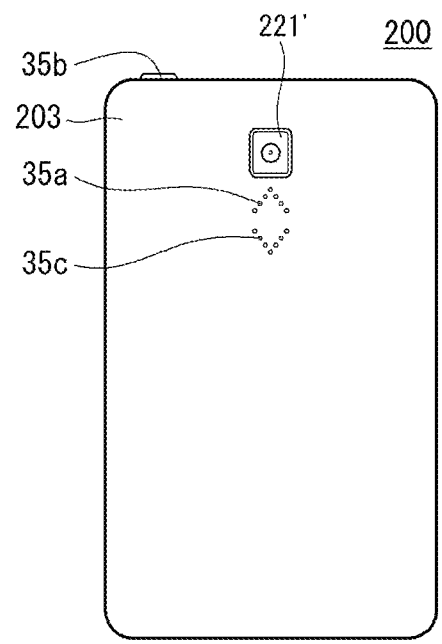
(b)

【Figure 14】
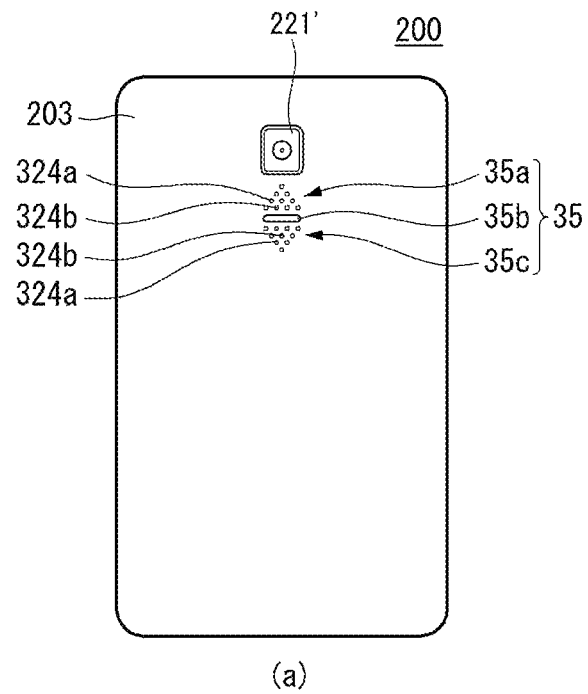
(a)
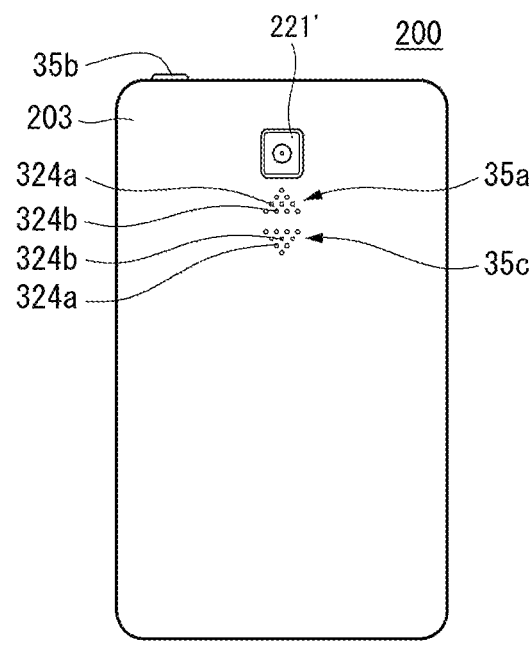
(b)

[Figure 15]
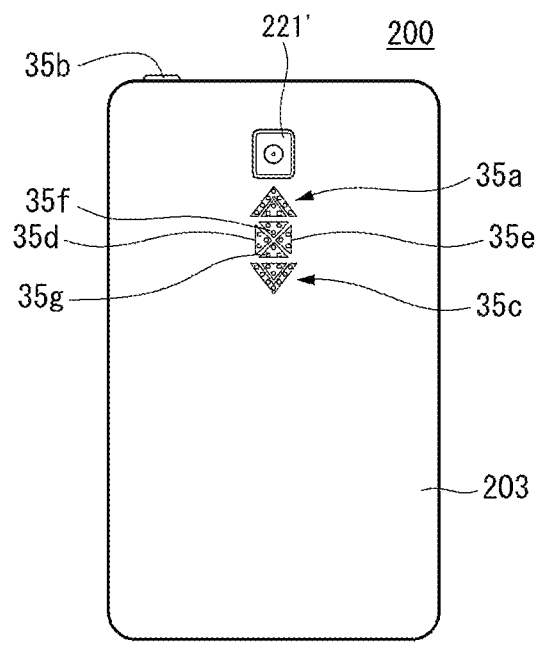

【Figure 16】
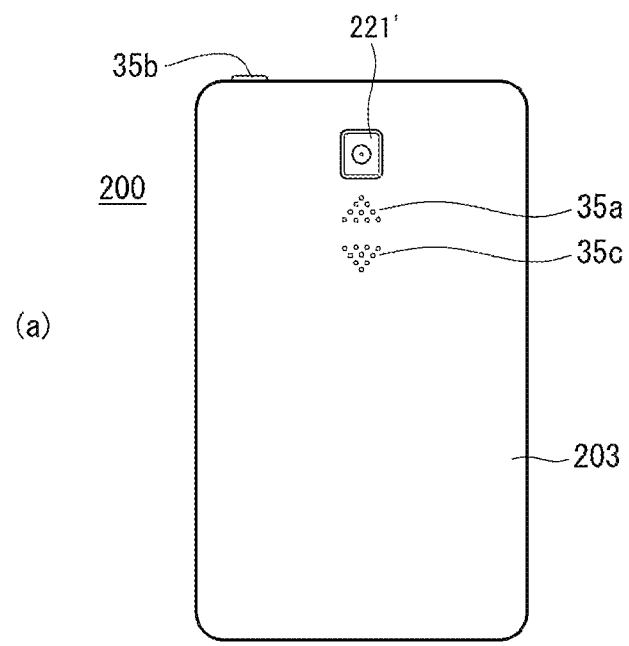
(a)
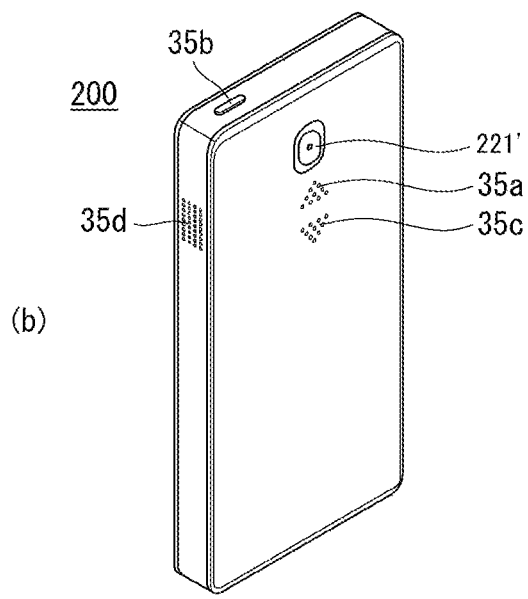
(b)

【Figure 17】
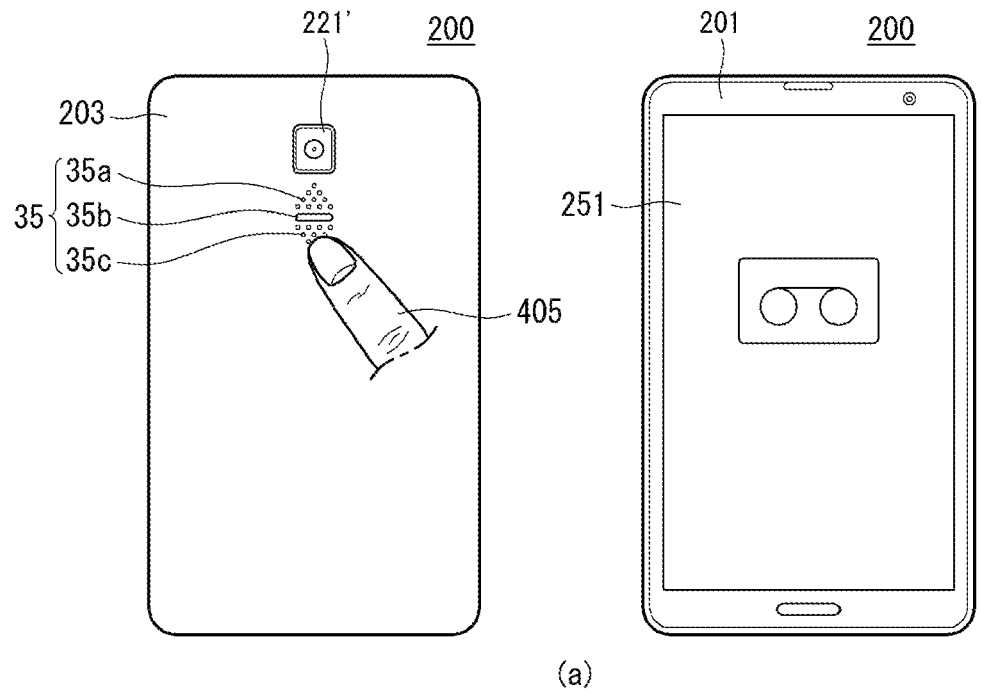
(a)
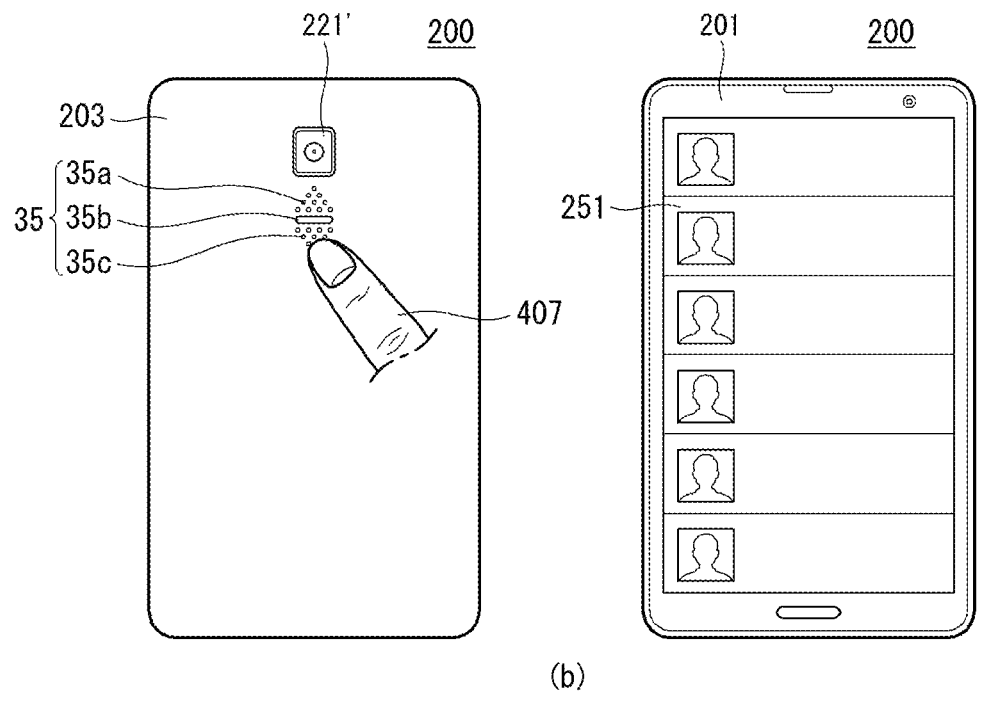
(b)

【Figure 18】
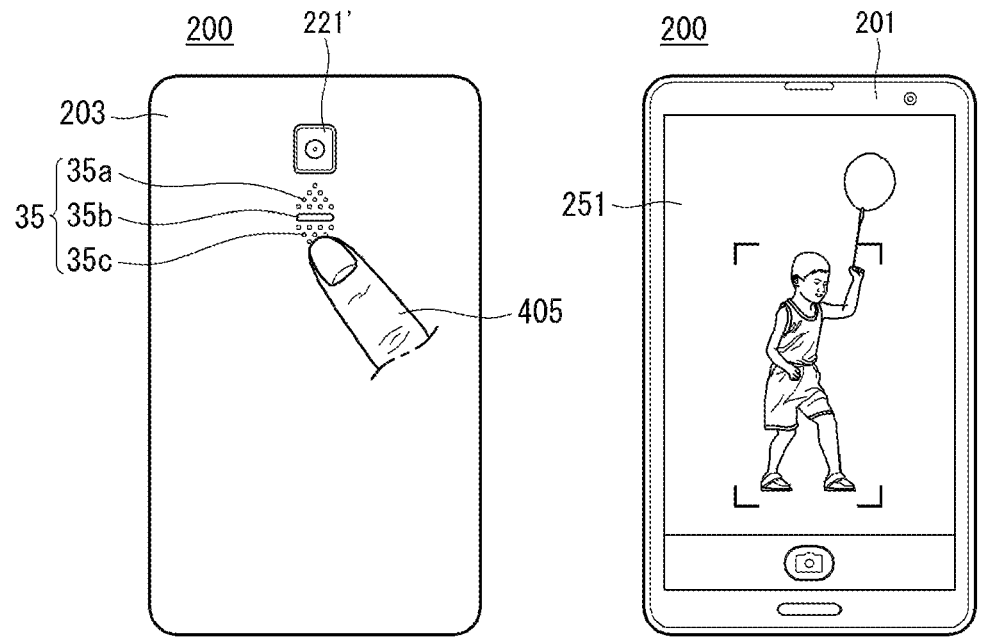
(a)
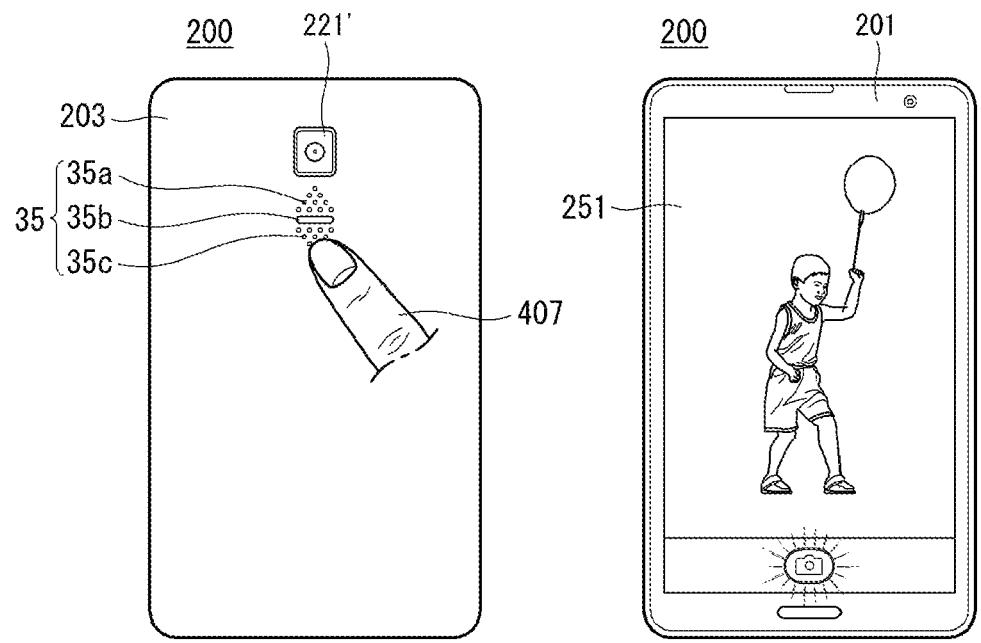
(b)

【Figure 19】
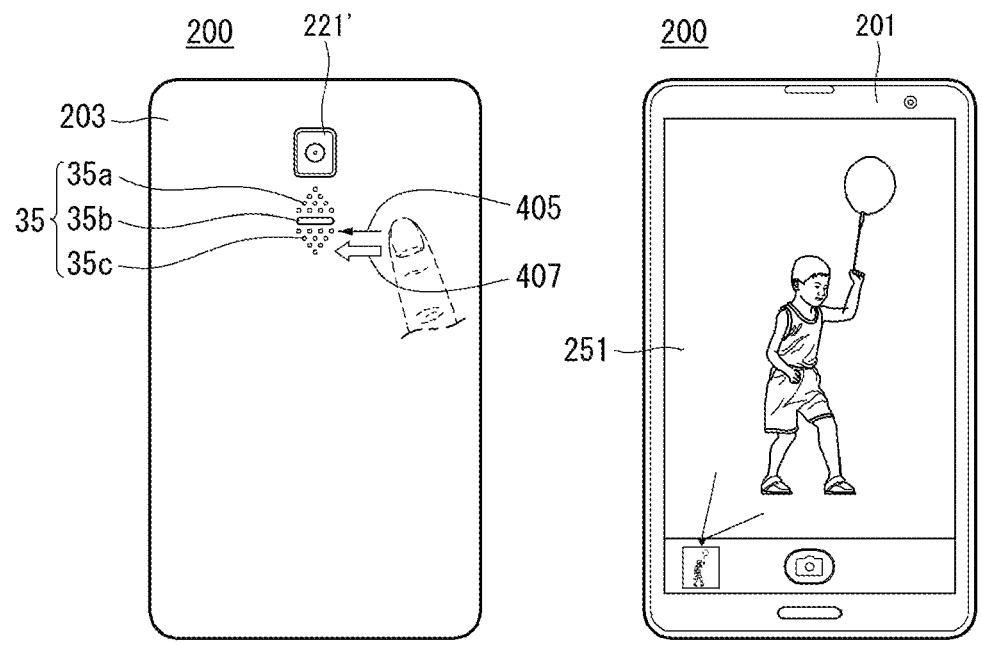

【Figure 20】
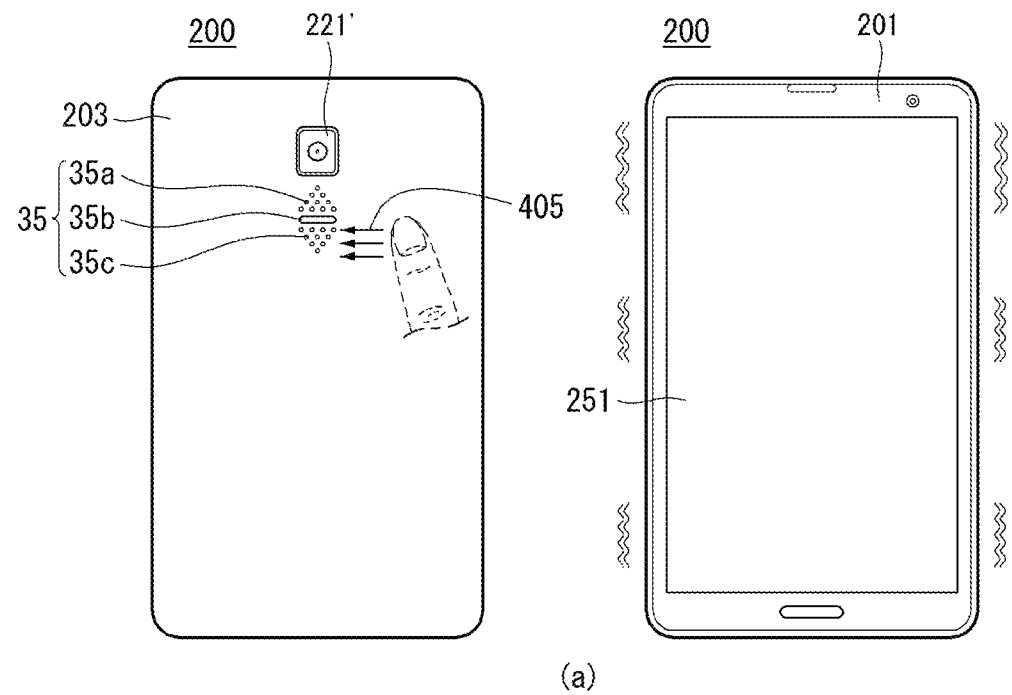
(a)
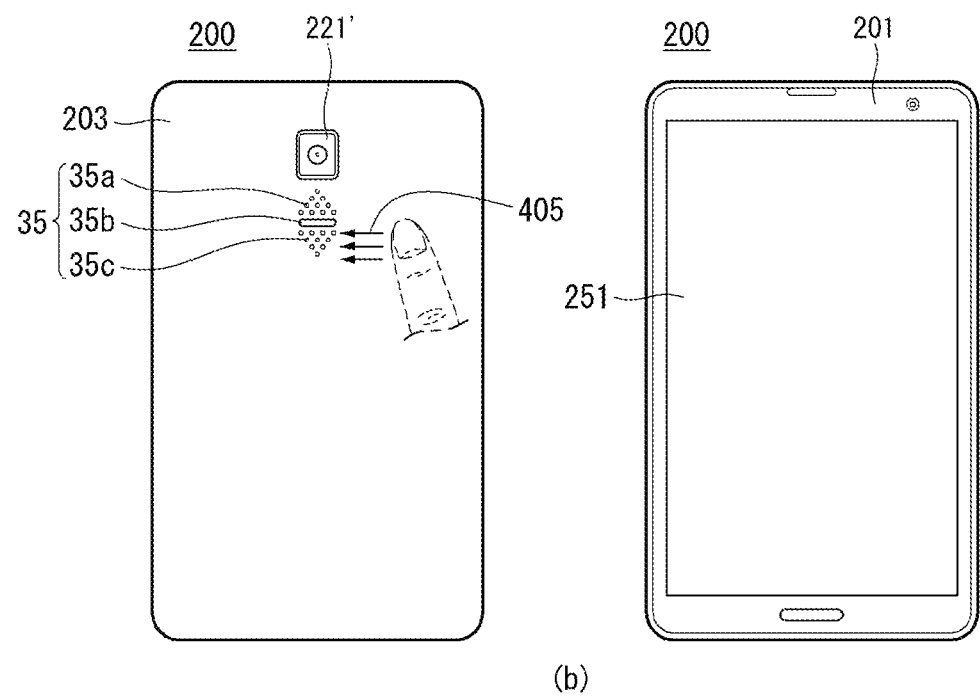
(b)

[Figure 21]
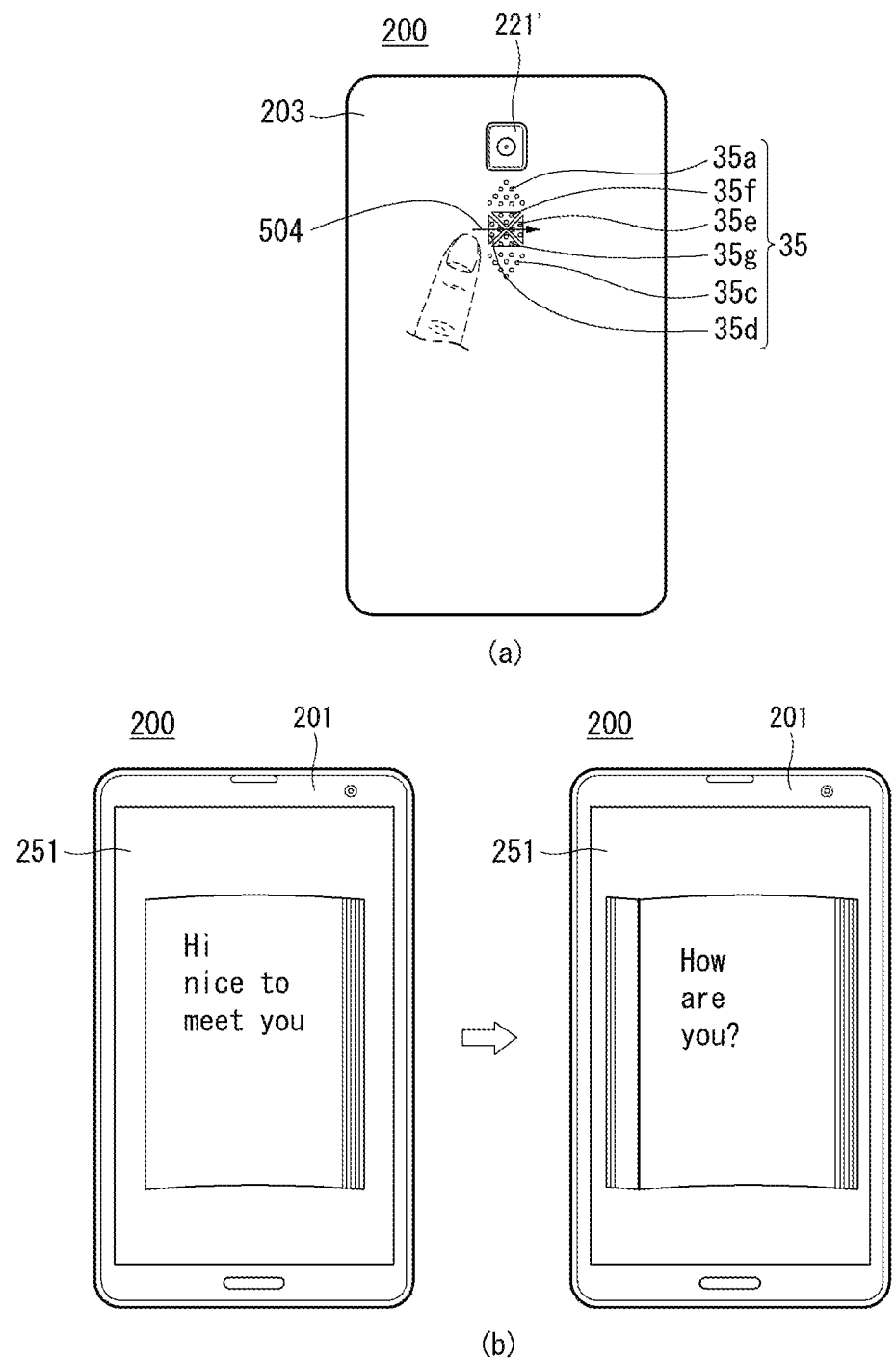

[Figure 22]
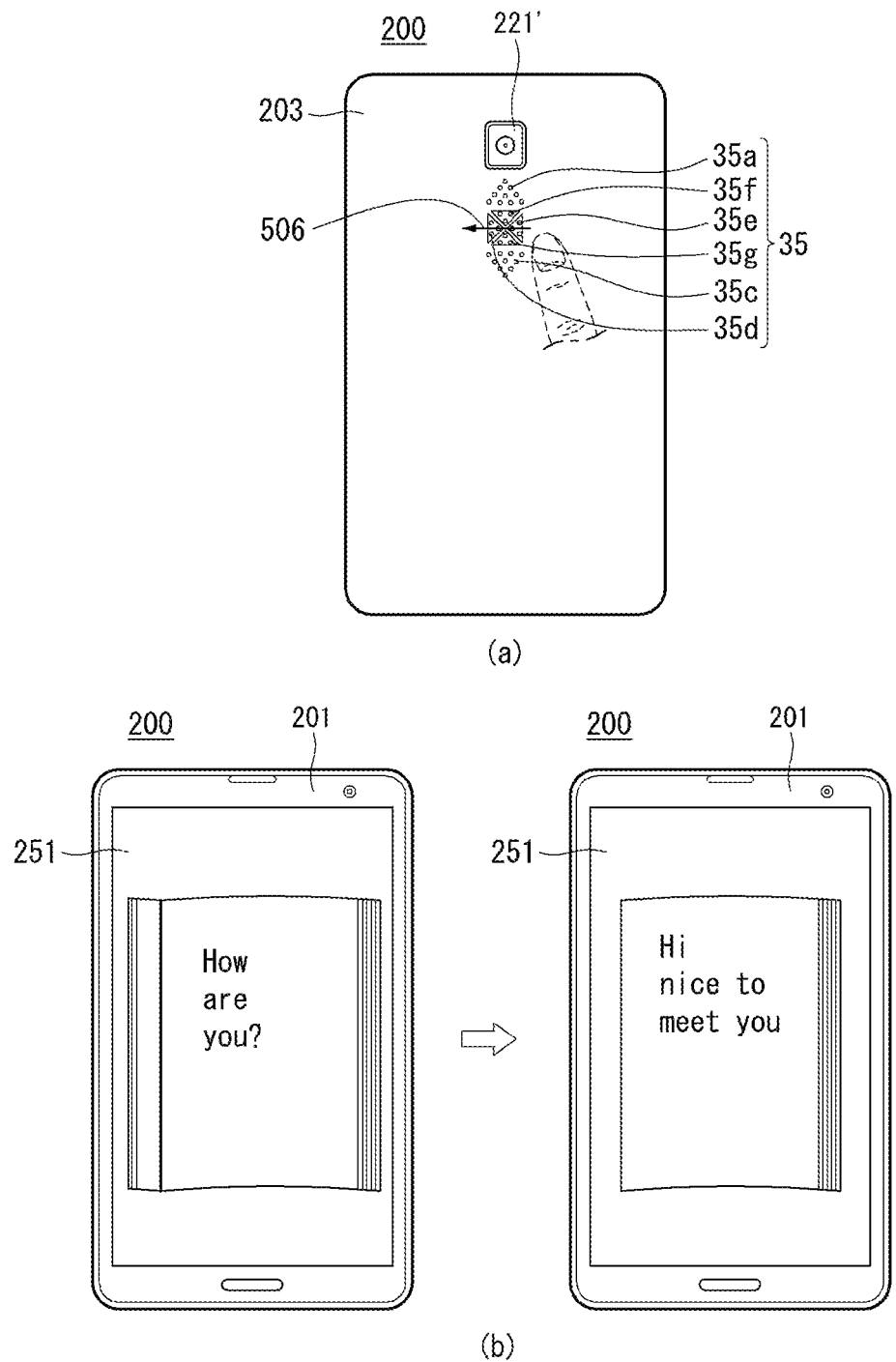

[Figure 23]
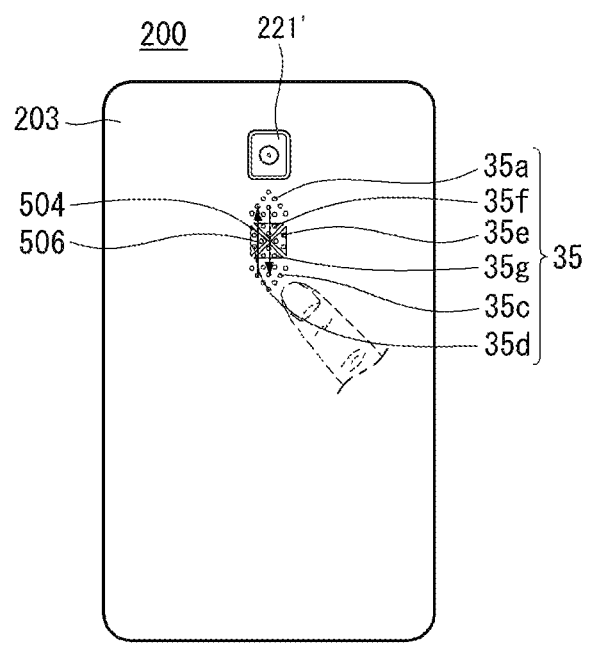

[Figure 24]
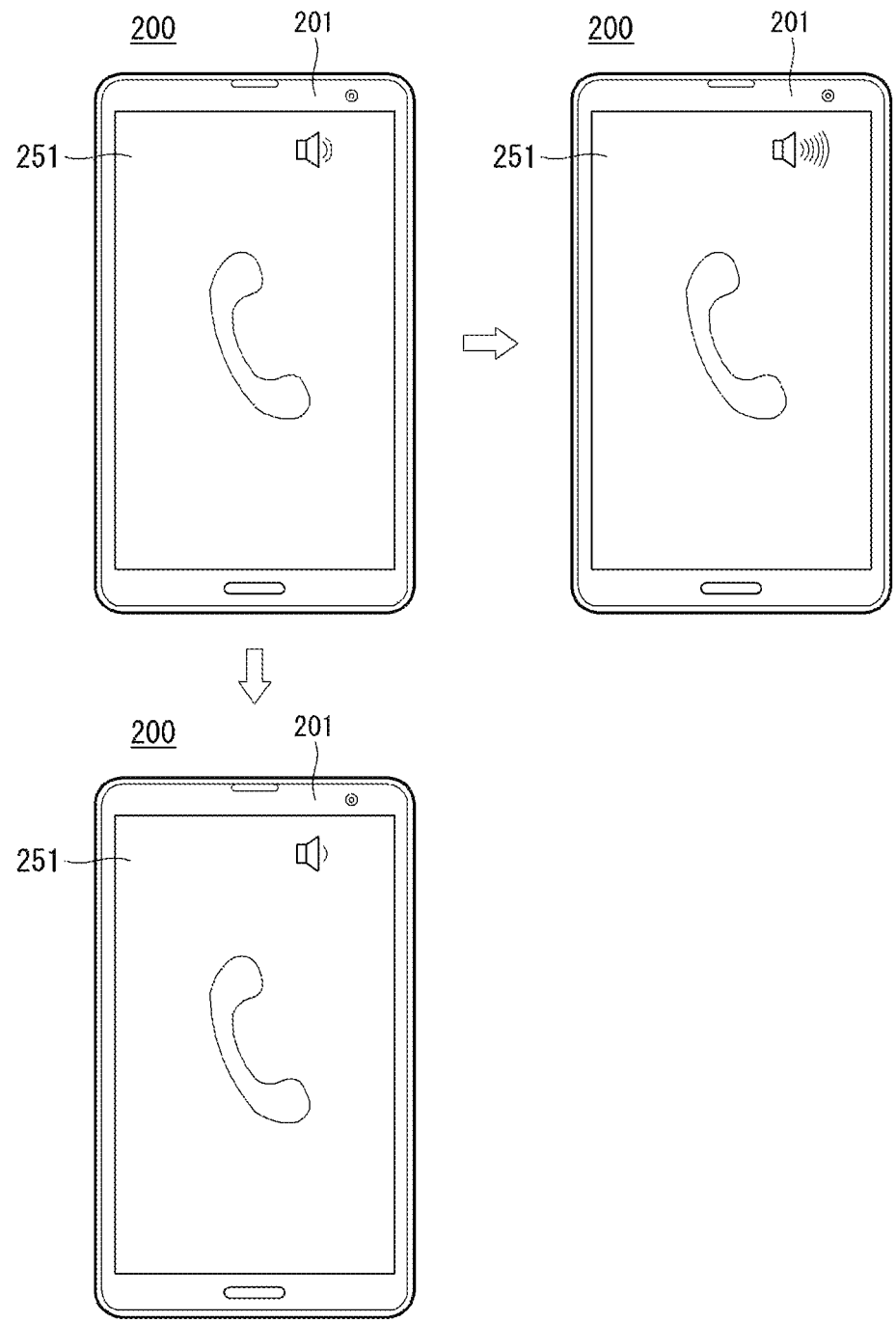

[Figure 25]
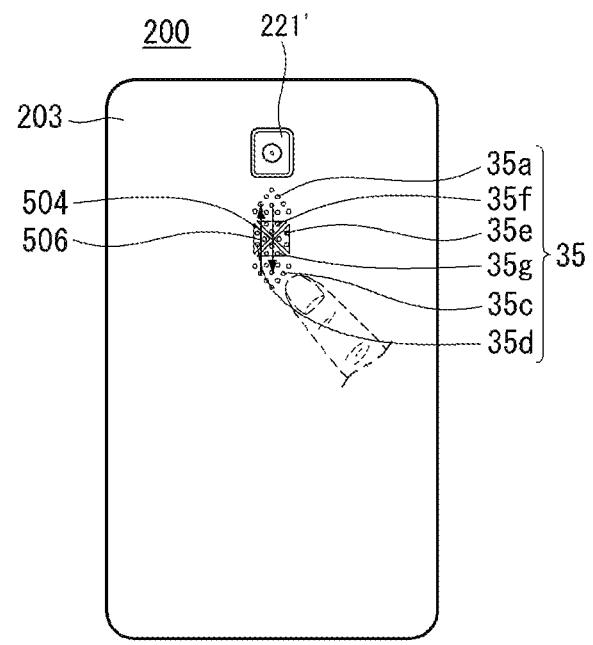

【Figure 26】
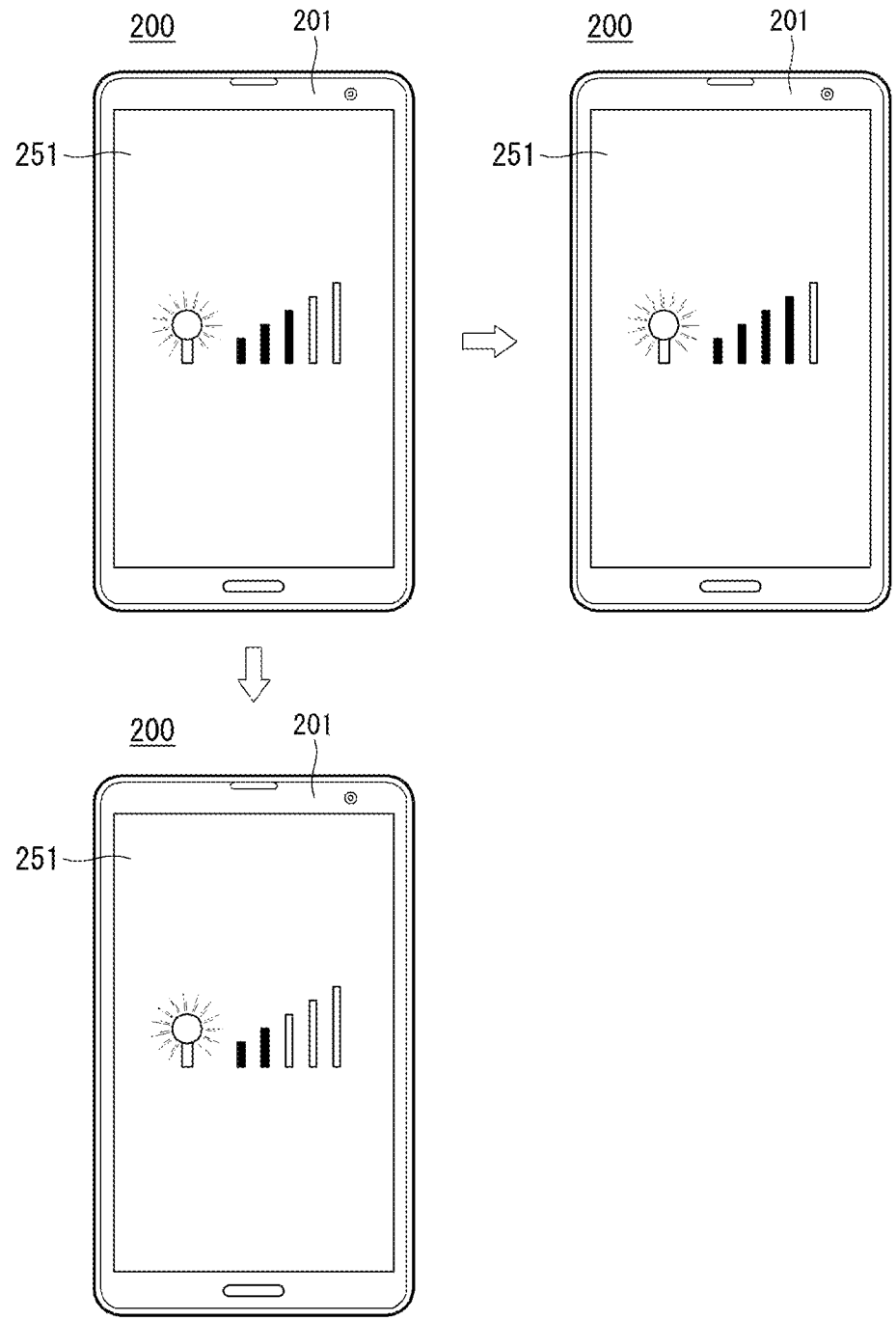

【Figure 27】
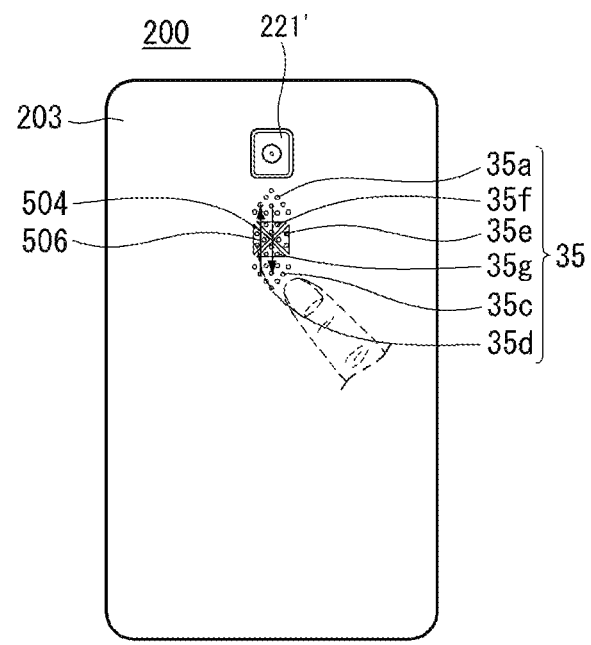

【Figure 28】
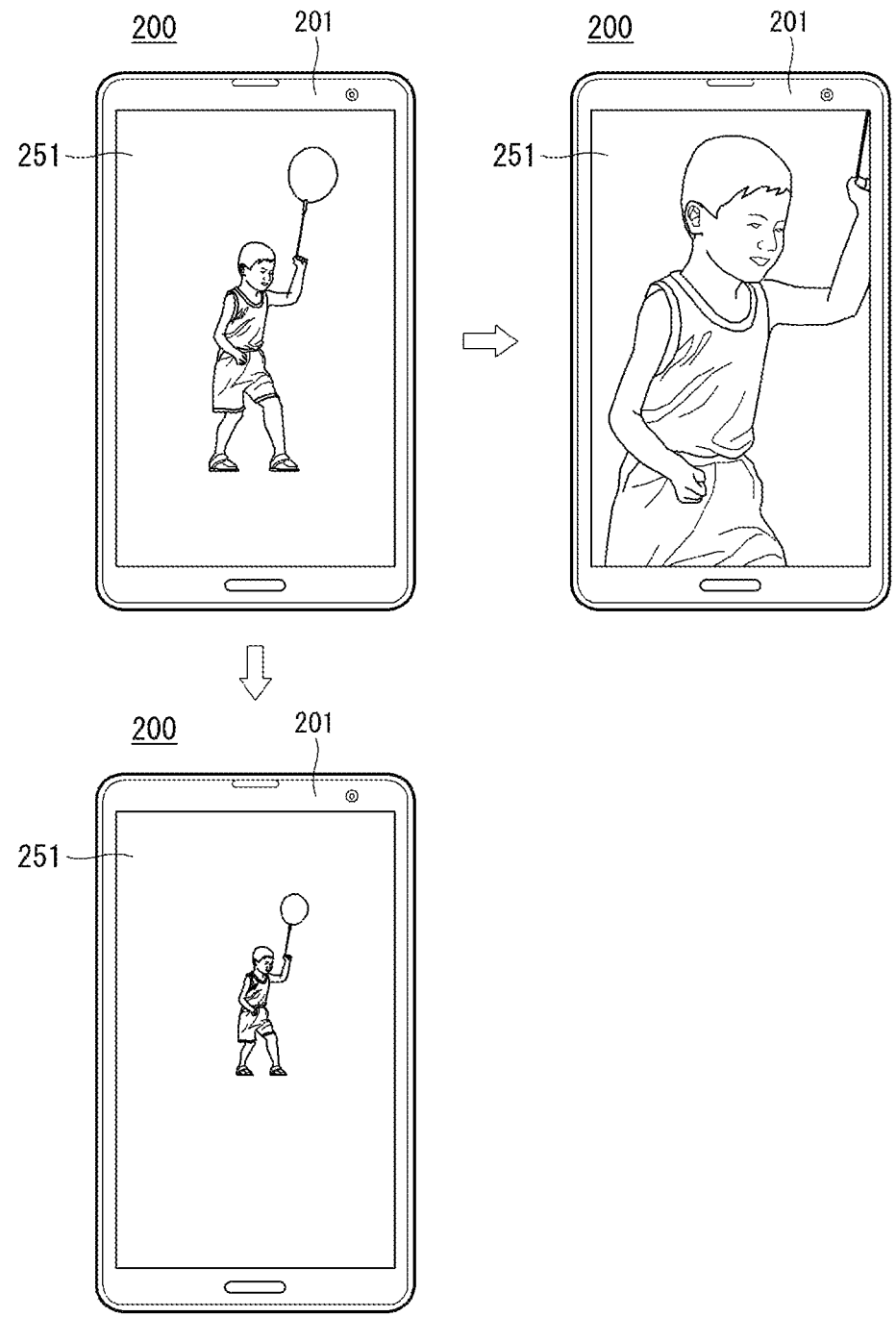

[Figure 29]
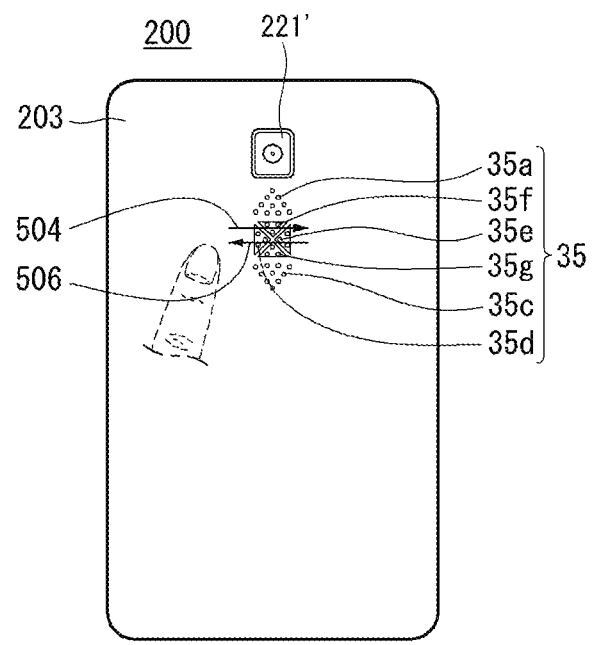

【Figure 30】
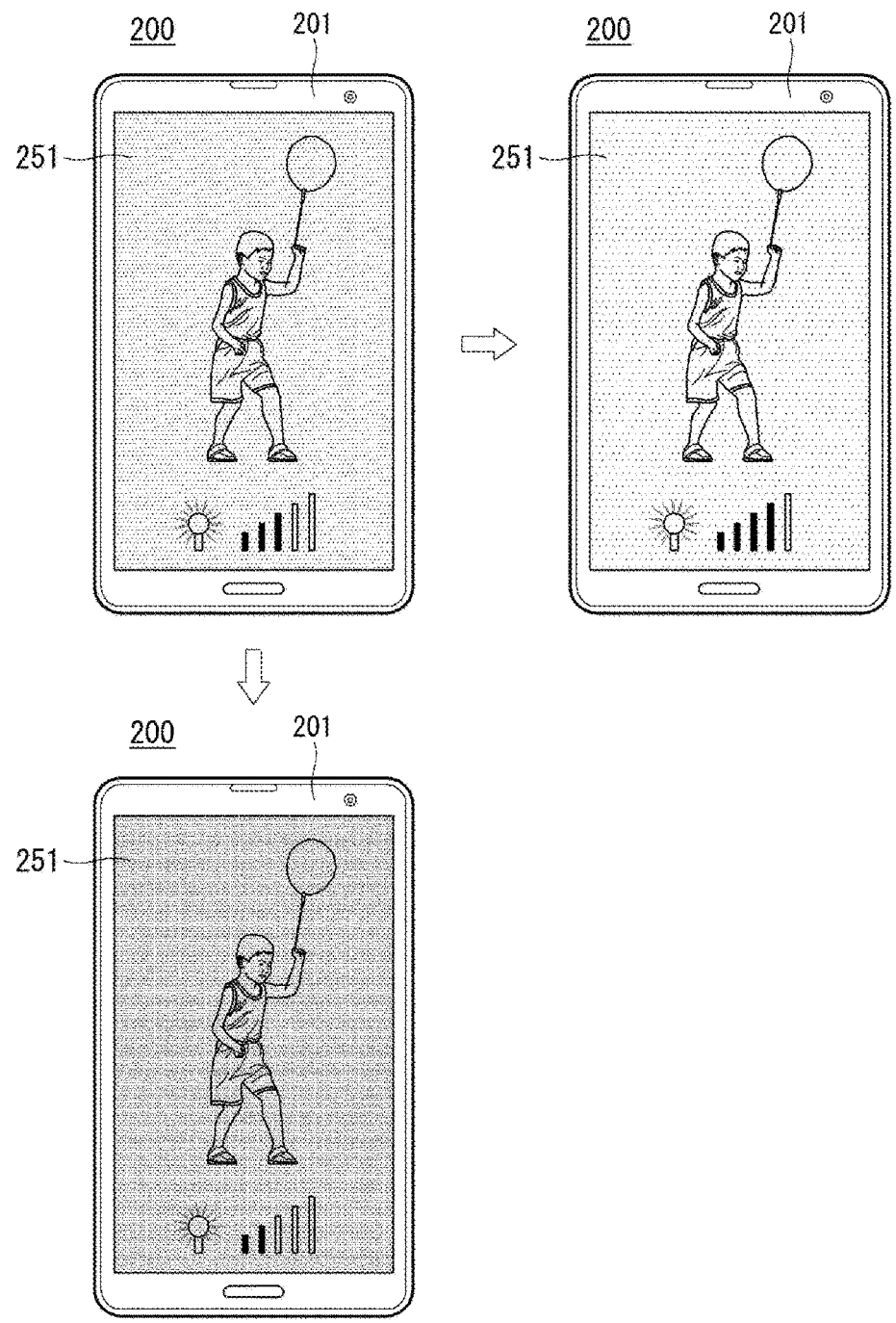

[Figure 31]
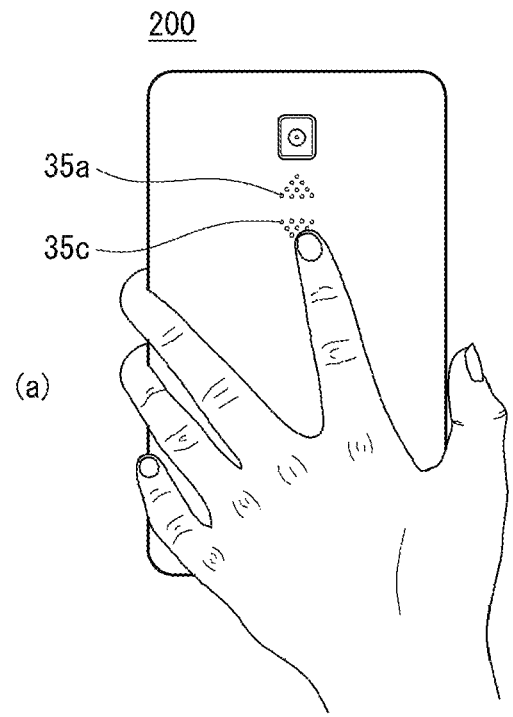
(a)
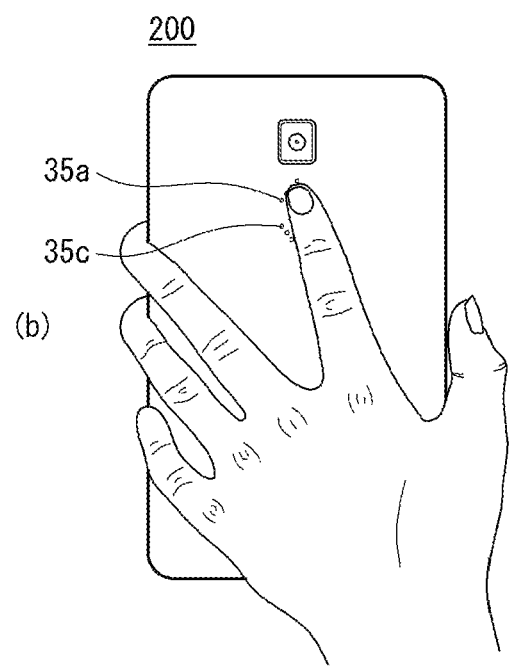
(b)

【Figure 32】
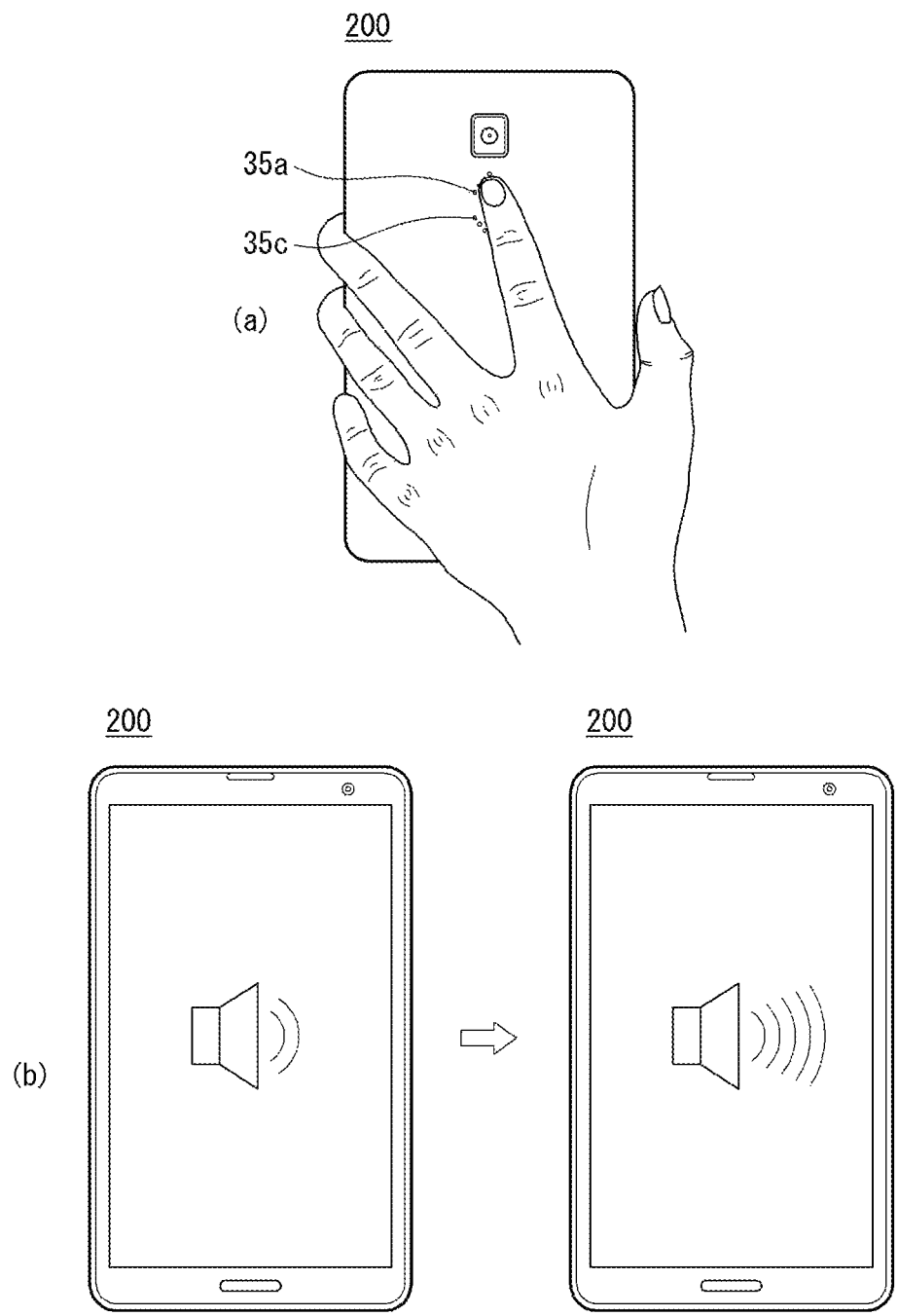

[Figure 33]
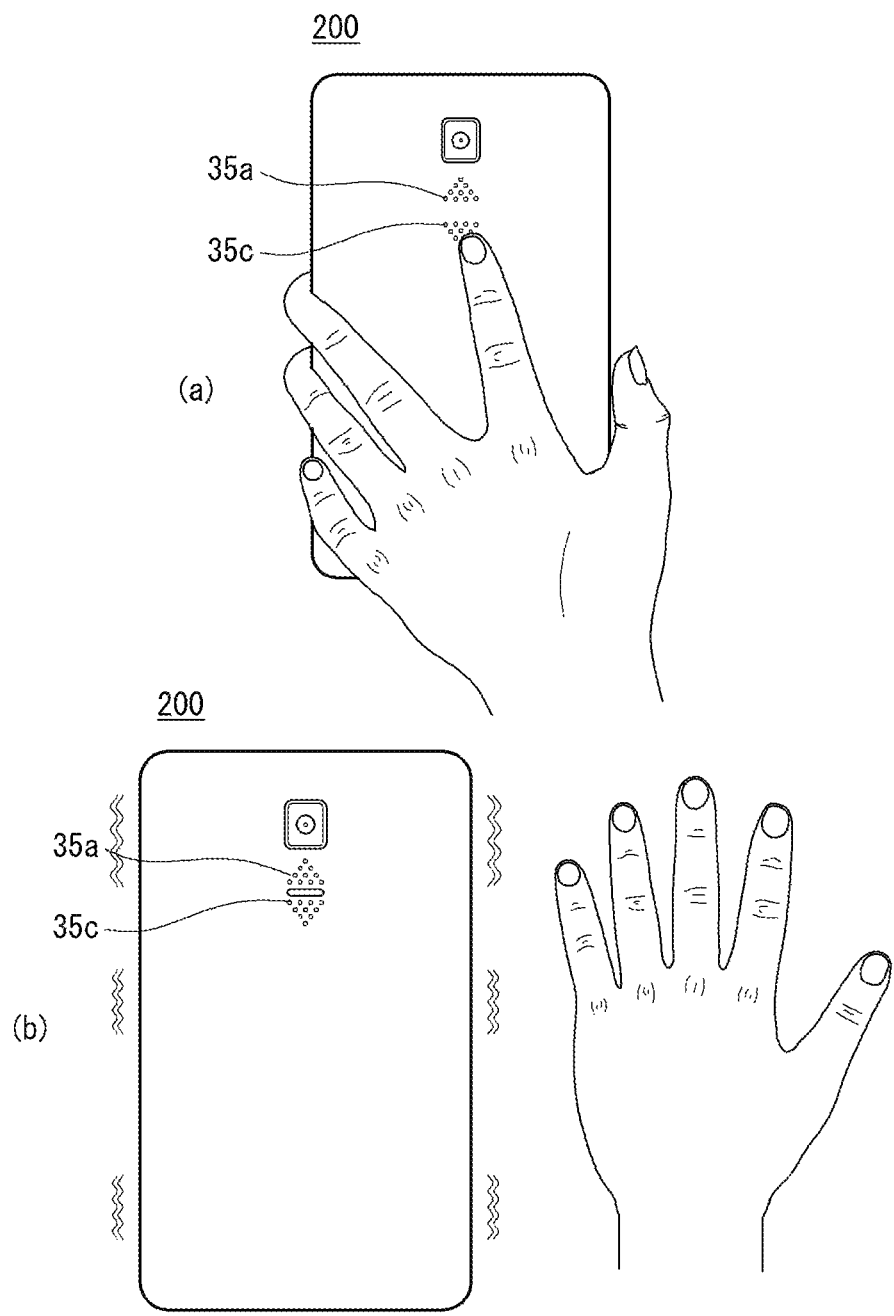

MOBILE TERMINAL

CROSS REFERENCE TO RELATED APPLICATIONS:

This application is the National Phase of PCT International Application No. PCT/KR2016/000971, filed on Jan. 29, 2016, which claims priority under 35 U.S.C. 119(a) to Patent Application No. 10-2015-0079047, filed in Republic of Korea on Jun. 4, 2015, all of which are hereby expressly incorporated by reference into the present application.

TECHNICAL FIELD

The present invention is related to a mobile terminal, and more particularly, a mobile terminal of which a control unit generates a control signal when two capacitance variations are obtained in an electrostatic sensor.

BACKGROUND ART

A terminal can be divided into a mobile/portable terminal and a stationary terminal depending on whether the terminal is movable. The mobile terminal can be divided into a handheld terminal and a vehicle mounted terminal according to whether the user can carry the mobile phone directly.

The functions of mobile terminals have been diversified. For example, there are data and voice communication, photographing and video shooting through a camera, voice recording, music file playback through a speaker system, and outputting an image or video to a display unit. Some terminals are equipped with electronic game play function or multimedia player function. In particular, modern mobile terminals can receive multicast signals that provide visual content such as broadcast and video or television programs.

Such a terminal has various functions, for example, a multimedia player having a complex function such as photographing or video shooting, playback of music or video file.

For supporting and increasing the functionality of such terminals, it is contemplated to improve the structural and/or software aspects of the terminal.

SUMMARY OF THE INVENTION

Accordingly, an object of the present disclosure is to address the above-described and other problems.

Another object of the present invention is to provide the mobile terminal which prevents its malfunction due to user's unintended touch.

According to an aspect of the present invention, there is provided a mobile terminal, comprising: a case; an input module installed at the case, the input module acquiring a touch input of a user; and a controller generating a control signal, wherein the input module includes: a button having a plurality of holes, the plurality of holes located on the case; a capacitive sensor located in the case, the capacitive sensor acquiring a variation of a electrostatic capacitance in accordance with the touch input; and a dielectric layer located between the button and the capacitive sensor; wherein the electrostatic capacitance includes: a first electrostatic capacitance generated between the user and the capacitive sensor through the plurality of holes; and a second electrostatic capacitance generated between the button and the capacitive sensor, and wherein the controller generates the control signal when the capacitive sensor acquires the variations of the first and second electrostatic capacitances.

According to another aspect of the present invention, the capacitive sensor may transform the electrostatic capacitance into a voltage, and the capacitive sensor may acquire the variation of the electrostatic capacitance when the capacitive sensor measures the voltage.

According to another aspect of the present invention, the input module may be located on a rear surface of the case.

According to another aspect of the present invention, the case may include a metal.

According to another aspect of the present invention, at least a portion of the plurality of holes may be filled with a first member, and a substance of the first member may be different from a substance of the case.

According to another aspect of the present invention, the first member may be dielectric.

According to another aspect of the present invention, the first member may be transparent.

According to another aspect of the present invention, the button may include a plurality of buttons, and at least one of the plurality of buttons may emit light through the first member.

According to another aspect of the present invention, the button may include: a first channel forming at least one hole among the plurality of holes; and a second channel forming at least another hole among the plurality of holes, the second channel spaced apart from the first channel.

According to another aspect of the present invention, the second channel may be located at a outer circumference of the first channel.

According to another aspect of the present invention, the controller may generate the control signal when the touch input is applied on both the first and second channels.

According to another aspect of the present invention, the mobile terminal may further comprise a push key acquiring an input from the user, the button may include a first button and a second button, and the push key may be positioned between the first button and the second button.

According to another aspect of the present invention, the controller may generate the control signal based on at least one of a moving speed of the touch input, an intensity of the touch input, a number of touches of the touch input, and a duration time of the touch input.

According to another aspect of the present invention, the capacitive sensor may include a plurality of sensor arrays electrically insulated from each other.

According to another aspect of the present invention, the control signal may include at least one of a signal for a voice recording, a signal for stopping the voice recording, a signal for photographing, a signal for focusing a picture, a signal for capturing a screen, a signal for converting into a silent mode, and a signal for converting into a vibration mode.

According to at least one of the embodiments of the present invention, the mobile terminal can prevent its malfunction due to user's unintended touch.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 1 is a block diagram illustrating a mobile terminal related to the present invention.

FIG. 2 is a perspective view of a mobile terminal according to an embodiment of the present invention.

FIG. 3 is a rear perspective view of the mobile terminal shown in FIG. 2

FIG. 4 is an exploded view of the mobile terminal shown in FIG. 2 and FIG. 3

FIG. 5 is a rear plan view and a sectional view of a mobile terminal according to an embodiment of the present invention.

FIG. 6 is a cross-sectional view illustrating a state before and after touch of a rear input module according to an embodiment of the present invention.

FIG. 7 is a circuit diagram illustrating a driving method of the rear input module according to an embodiment of the present invention.

FIG. 8 is a cross-sectional view illustrating a rear input module according to another embodiment of the present invention.

FIG. 9 is a rear plan view showing a mobile terminal according to an embodiment of the present invention.

FIG. 10 is a rear enlarged plan view showing a rear input module according to another embodiment of the present invention.

FIG. 11 is a view showing a method of operating a button.

FIG. 12 is a cross-sectional view illustrating a rear input module according to another embodiment of the present invention.

FIGS. 13 to 15 are rear plan views illustrating a mobile terminal according to another embodiment of the present invention.

FIG. 16 is a rear plan view and a perspective view illustrating a mobile terminal according to another embodiment of the present invention.

FIGS. 17 through 33 are diagrams illustrating various embodiments of the present invention.

DETAILED DESCRIPTION OF EMBODIMENTS

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

The following embodiments of the present invention are provided to those skilled in the art in order to describe the present invention more completely. Accordingly, shapes and sizes of elements shown in the drawings may be exaggerated for clarity.

Mobile terminals disclosed herein may be implemented using a variety of different types of devices. Examples of such devices include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

FIG. 1 is a block diagram of an electronic device according to an exemplary embodiment of the invention.

The electronic device 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

Referring now to FIG. 1, the electronic device 100 is shown having wireless communication unit 110 configured with several commonly implemented components. For instance, the wireless communication unit 110 typically includes one or more components which permit wireless communication between the electronic device 100 and a wireless communication system or network within which the electronic device is located.

The wireless communication unit 110 typically includes one or more modules which permit communications such as wireless communications between the electronic device 100 and a wireless communication system, communications between the electronic device 100 and another electronic device, communications between the electronic device 100 and an external server. Further, the wireless communication unit 110 typically includes one or more modules which connect the electronic device 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the electronic device, the surrounding environment of the electronic device, user information, and the like. For example, in FIG. 1, the sensing unit 140 is shown having a proximity sensor 141 and an illumination sensor 142. If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The electronic device 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154.

The display unit 151 may have an inter-layered structure or an integrated structure with a touch sensor in order to facilitate a touch screen. The touch screen may provide an output interface between the electronic device 100 and a user, as well as function as the user input unit 123 which provides an input interface between the electronic device 100 and the user.

The interface unit 160 serves as an interface with various types of external devices that can be coupled to the electronic device 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the electronic device 100 may perform assorted control functions associated with a connected external device, in response to the external device being connected to the interface unit 160.

The memory 170 is typically implemented to store data to support various functions or features of the electronic device 100. For instance, the memory 170 may be configured to store application programs executed in the electronic device 100, data or instructions for operations of the electronic device 100, and the like. Some of these application programs may be downloaded from an external server via wireless communication. Other application programs may be installed within the electronic device 100 at time of manufacturing or shipping, which is typically the case for basic functions of the electronic device 100 (for example, receiving a call, placing a call, receiving a message, sending a message, and the like). It is common for application programs to be stored in the memory 170, installed in the electronic device 100, and executed by the controller 180 to perform an operation (or function) for the electronic device 100.

The controller 180 typically functions to control overall operation of the electronic device 100, in addition to the operations associated with the application programs. The controller 180 may provide or process information or functions appropriate for a user by processing signals, data, information and the like, which are input or output by the various components depicted in FIG. 1, or activating application programs stored in the memory 170. As one example, the controller 180 controls some or all of the components illustrated in FIG. 1 according to the execution of an application program that have been stored in the memory 170.

The power supply unit 190 can be configured to receive external power or provide internal power in order to supply appropriate power required for operating elements and components included in the electronic device 100. The power supply unit 190 may include a battery, and the battery may be configured to be embedded in the device body, or configured to be detachable from the device body.

Referring still to FIG. 1, various components depicted in this figure will now be described in more detail.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external electronic device, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the electronic device 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the electronic device 100 and a wireless communication system, communications between the electronic device 100 and another electronic device 100, or communications between the electronic device and a network where another electronic device 100 (or an external server) is located, via wireless area networks. One example of the wireless area networks is a wireless personal area networks.

In some embodiments, another electronic device (which may be configured similarly to the electronic device 100) may be a wearable device, for example, a smart watch, a smart glass or a head mounted display (HMD), which is able to exchange data with the electronic device 100 (or otherwise cooperate with the electronic device 100). The short-range communication module 114 may sense or recognize the wearable device, and permit communication between the wearable device and the electronic device 100. In addition, when the sensed wearable device is a device which is authenticated to communicate with the electronic device 100, the controller 180, for example, may cause transmission of data processed in the electronic device 100 to the wearable device via the short-range communication module 114. Hence, a user of the wearable device may use the data processed in the electronic device 100 on the wearable device. For example, when a call is received in the electronic device 100, the user may answer the call using the wearable device. Also, when a message is received in the electronic device 100, the user can check the received message using the wearable device.

The location information module 115 is generally configured to detect, calculate, derive or otherwise identify a position of the electronic device. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the electronic device. As one example, when the electronic device uses a GPS module, a position of the electronic device may be acquired using a signal sent from a GPS satellite. As another example, when the electronic device uses the Wi-Fi module, a position of the electronic device can be acquired based on information related to a wireless access point (AP) which transmits or receives a wireless signal to or from the Wi-Fi module.

The input unit 120 may be configured to permit various types of input to the electronic device 100. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the electronic device 100. As another example, the cameras 121 may be located in a stereoscopic arrangement to acquire left and right images for implementing a stereoscopic image.

The microphone 122 is generally implemented to permit audio input to the electronic device 100. The audio input can be processed in various manners according to a function being executed in the electronic device 100. If desired, the microphone 122 may include assorted noise removing algorithms to remove unwanted noise generated in the course of receiving the external audio.

The user input unit 123 is a component that permits input by a user. Such user input may enable the controller 180 to control operation of the electronic device 100. The user input unit 123 may include one or more of a mechanical input element (for example, a key, a button located on a front and/or back surface or a side surface of the electronic device 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the electronic device at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the electronic device, surrounding environment information of the electronic device, user information, or the like. The controller 180 generally cooperates with the sending unit 140 to control operation of the electronic device 100 or execute data processing, a function or an operation associated with an application program installed in the electronic device based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact. The proximity sensor 141 may be arranged at an inner region of the electronic device covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitive proximity sensor, a magnetic proximity sensor, an infrared proximity sensor, and the like. When the touch screen is implemented as a capacitive touch sensor, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like).

In general, controller 180 processes data corresponding to proximity touches and proximity touch patterns sensed by the proximity sensor 141, and cause output of visual information on the touch screen. In addition, the controller 180 can control the electronic device 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the electronic device 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the electronic device 100. For example, the display unit 151 may display execution screen information of an application program executing at the electronic device 100 or user interface (UI) and graphic user interface (GUI) information in response to the execution screen information.

In some embodiments, the display unit 151 may be implemented as a stereoscopic display unit for displaying stereoscopic images.

A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the electronic device 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the electronic device 100.

An optical output module 154 can output a signal for indicating an event generation using light of a light source. Examples of events generated in the electronic device 100 may include message reception, call signal reception, a missed call, an alarm, a schedule notice, an email reception, information reception through an application, and the like.

A signal output by the optical output module 154 may be implemented in such a manner that the electronic device emits monochromatic light or light with a plurality of colors. The signal output may be terminated as the electronic device senses that a user has checked the generated event, for example.

The interface unit 160 serves as an interface for external devices to be connected with the electronic device 100. For example, the interface unit 160 can receive data transmitted from an external device, receive power to transfer to elements and components within the electronic device 100, or transmit internal data of the electronic device 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the electronic device 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the electronic device 100 via the interface unit 160.

When the electronic device 100 is connected with an external cradle, the interface unit 160 can serve as a passage to allow power from the cradle to be supplied to the electronic device 100 or may serve as a passage to allow various command signals input by the user from the cradle to be transferred to the electronic device there through. Various command signals or power input from the cradle may operate as signals for recognizing that the electronic device is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The electronic device 100 may also be operated in relation to a network storage device that performs the storage function of the memory 170 over a network, such as the Internet.

The controller 180 may typically control the general operations of the electronic device 100. For example, the controller 180 may set or release a lock state for restricting a user from inputting a control command with respect to applications when a status of the electronic device meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 receives external power or provide internal power and supply the appropriate power required for operating respective elements and components included in the electronic device 100. The power supply unit 190 may include a battery, which is typically rechargeable or be detachably coupled to the device body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

The electronic device may be expanded to a wearable device the user can directly wear beyond a hand-held device, which the user has and uses in his or her hand. Examples of the wearable device include a smart watch, a smart glass, and a head mounted display (HMD). Examples of the electronic device expanded to the wearable device will now be described in more detail.

The wearable device may be configured to exchange (or interwork) data with another electronic device 100. The short-range communication module 114 may sense (or recognize) the wearable device, which is positioned around the electronic device 100 and can communicate with the electronic device 100. Furthermore, when the sensed wearable device is a device which is authenticated to communicate with the electronic device 100, the controller 180 may transmit at least a portion of data processed in the electronic device 100 to the wearable device via the short-range communication module 114. Thus, the user of the wearable device may use the data processed in the electronic device 100 on the wearable device. For example, when a call is received in the electronic device 100, the user may answer the call using the wearable device. Also, when a message is received in the electronic device 100, the user may check the received message using the wearable device.

At least a portion of the components illustrated in FIG. 1 may cooperatively operate to implement an operation, a control, or a control method of the electronic device 100 according to various embodiments of the invention that will be described below. The operation, the control, or the control method of the electronic device 100 may be implemented by the execution of at least one application program stored in the memory 170.

The watch type electronic device 100 according to the embodiment of the invention is a kind of the mobile terminal which the user wears on his/her wrist. The watch type electronic device 100 may include some or all of the components illustrated in FIG. 1. The characteristics of the watch type electronic device 100 related to its shape will now be described in detail.

FIG. 2 is a perspective view of a mobile terminal according to an embodiment of the present invention, and FIG. 3 is a rear perspective view of the mobile terminal shown in FIG. 2.

The mobile terminal 200 may include a bar-shaped terminal body. However, the present invention is not limited thereto, and can be applied to various structures such as a slide type, a folder type, a swing type, and a swivel type in which two or more bodies are movably coupled to each other.

The terminal body may include a case (casing, housing, cover, etc.) which forms an appearance. In this embodiment, the case may be divided into a front case 201, a rear case 202 and a battery cover 203. Various electronic components can be accommodated in the space formed between the front case 201 and the rear case 202. At least one frame 204 (see FIG. 4) may be additionally disposed between the front case 201 and the rear case 202.

The cases may be formed by injection molding a synthetic resin or may be formed of a metal material such as stainless steel (STS), titanium (Ti), aluminum (Al), or the like.

A display unit 251, a sound output module 252, a proximity sensor 241, a camera module 221, and the like may be disposed in the front case 201. A microphone 222, a lateral side input unit 232, an interface 270, and the like may be disposed on the front case 201 and the lateral side of the rear case 202. The camera module 221 may be referred to as a front camera module 221. The sound output module 252 may be referred to as a front sound output module 252.

The display unit 251 occupies most of the front surface of the front case 201. The display unit 251 is disposed on the front surface of the terminal body to output image information. The sound output module 252, the proximity sensor 241 and the camera module 221 may be disposed on an area adjacent to an end of the display unit 251. The front input unit 231 may be disposed on another area adjacent to another end of the display unit 251.

The front input unit 231 may be an example of the user input unit. The front input unit 231 may include a plurality of operation units. The operating units may also be referred to as manipulating portions and may be employed in any manner as long as the user is operating in a tactile manner with a tactile impression. In this embodiment, the front input unit 231 may be constituted by a touch key. However, the present invention is not limited thereto, and a push key may be added to the front input unit 231.

In addition, the display unit 251 may form a touch screen by using the touch sensor, and in this case, the touch screen may be a user input unit. Accordingly, the front input unit 231 may not be provided on the front surface of the terminal. In this case, the mobile terminal 200 can be configured such that the input operation to the main body of the terminal can be performed only through the display unit 251 and a rear input module 233 to be described later.

The lateral side input unit 232 may be another example of the user input unit 130. The lateral side input unit 232 may receive a command such as the adjustment of the volume of the sound outputted from the sound output module 252 or the switching to the touch recognition mode of the display unit 251.

Referring to FIG. 3, a camera module 221' may be additionally mounted on the rear surface of the terminal body, that is, the rear case 202. The camera module 221' may be referred to as a rear camera module 221'. The camera module 221' may face a rear side of the mobile terminal 200, whereas the camera module 221 (see FIG. 2) may face a front side of the mobile terminal. The camera module 221' may have pixels different from those of the camera module 221.

For example, the front camera module 221 may have few pixels so that it is easy to capture the face of the user and transmit the image to the other party in case of a video call or the like. In many cases, the rear camera module 221' photographs a general subject and does not immediately transmit it. The rear camera module 221' may have many pixels. The camera modules 221 and 221' may be installed in the terminal body such that they can be rotated or pop-up.

A flash and a mirror (not shown) may be additionally disposed adjacent to the rear camera module 221'. The flash may illuminate the subject when the subject is photographed by the rear camera module 221'. The mirror may allow the user to illuminate the user's face or the like when the user intends to take a picture of himself/herself (self-photographing) using the camera module 221'.

A sound output module 252' may be further disposed on the rear surface of the terminal body. The sound output module 252' may be referred to as a rear sound output module 252'. The rear sound output module 252' may implement the stereo sound together with the front sound output module 252 (see FIG. 2) and may be used for the implementation of the speakerphone mode during a call.

A battery 291 for supplying power to the mobile terminal 200 can be mounted in the terminal body. The battery 291 can be configured as an example of the power supply unit 190 (see FIG. 1). The battery 291 may be built in the terminal body or may be detachably attached to the terminal body.

A rear input module 233 may be disposed on the rear surface of the terminal body. The rear input module 233 can be configured as another example of the user input portion. The rear input module 233 may be positioned adjacent to the rear camera module 221' exposed at the rear surface of the terminal body.

The rear input module 233 may be operated to receive a command for controlling the operation of the mobile terminal 200. The contents input to the rear input module 233 can be variously set. The rear input module 233 may receive commands for controlling the volume of the sound outputted from the sound output modules 252 and 252' or the volume of the sound outputted from the display module 251. The rear input module 233 may receive commands such as power on/off, start, switching to the touch recognition mode of the touch screen.

The rear input module 233 of the present invention can be implemented in a form in which at least a part of the rear input module 233 is capable of touch inputting. The detailed configuration of the rear input module 233 will be described later.

FIG. 4 is an exploded view of the mobile terminal shown in FIGS. 2 and 3.

Referring to FIG. 4, a printed circuit board (PCB) 281 is embedded in the terminal body. The printed circuit board 281 may be mounted on the front case 201 or the rear case 202, or may be mounted on another structure. The other structure may be a frame 204. Hereinafter, it is described that the front case 201 and the rear case 202 can be assembled, but the present invention is not limited thereto. The cases 201 and 202 may be integrally formed. The printed circuit board 281 may be an example of a circuit board 281.

The circuit board 281 may be configured as an example of a controller 180 (see FIG. 1) for operating various functions of the mobile terminal 200. Various electronic components may be mounted on the circuit board 281 for performing functions as the controller 180. A plurality of circuit boards 281 may be provided and perform the function of the controller 180 as the plurality of circuit boards 281 are combined. For example, the circuit board 281 may include a main circuit board and a sub circuit board, which are electrically connected to each other. The main circuit board and the sub circuit board may have a spatially extended structure as they are overlapped with each other in the thickness direction of the terminal body.

The rear case 202 may be provided with a battery accommodating portion 292 for accommodating the battery 291. The battery cover 203 may be detachably coupled to the rear case 202 so as to cover the battery accommodating portion 292. The battery 291 may be embedded in the terminal body, so it may not that the battery 291 is detachably coupled to the terminal body.

The camera module 221' may be electrically connected to the circuit board 281. The camera module 221' may be disposed on the rear surface of the terminal body. The camera module 221' can photograph the back of the terminal.

A rear input module 233 may be provided on the rear surface of the main body of the mobile terminal so as to be operable to receive a control command. The battery cover 203 may have a through-hole 203a corresponding to the camera module 221'. The camera module 221' may be exposed to the rear surface of the terminal body through the through-hole 203a.

The rear input module 233 may be disposed to overlap with the display unit 251 in the thickness direction of the terminal body. For example, the rear input module 233 may be disposed at the rear upper end of the terminal body, so that the user can easily operate the terminal body with the index finger when the terminal body is held with one hand of the user. However, the present invention is not limited thereto, and the position of the rear input module 233 may be changed.

The rear input module 233 can be provided on the rear surface of the main body of the terminal, so that a new type of user interface using the rear input module 233 can be realized. The rear input module 233 can replace at least some functions of the front input 231. In case that the front input unit 231 is not disposed on the front surface of the terminal body, the display unit 251 can be configured as a larger screen.

The rear input module 233 may include an capacitive sensor 21, a dielectric layer 29, and at least one button 35.

The capacitive sensor 21 can be accommodated in the input module accommodating portion 202a of the rear case 202. The capacitive sensor 21 can sense the capacitance of the button 35 which the user touches and can transmit the signal to the control unit 180 (see FIG. 1). The area of the capacitive sensor 21 may be greater than the area of the button 35 to sense the electrostatic capacity of the at least one button 35. The capacitive sensor 21 may include a plurality of sensor arrays insulated from each other. Since each sensor array is isolated from each other, it may not be affected by the capacitance detected by the adjacent sensor array. Further, since they are insulated from each other, the ghost phenomenon caused by multi-touch can be prevented. The ghost phenomenon may refer to a phenomenon: the multi-touched positions are not detected when two or more touches are made, but the averaged point is recognized as a touch point.

The dielectric layer 29 may be located on the upper surface of the capacitive sensor 21. The dielectric layer 29 can determine the capacitance between the button 35 and the capacitive sensor 21. The capacitance between the button 35 and the capacitive sensor 21 can be expressed by the following equation.

$$C = \varepsilon \frac{A}{d} \qquad \text{[Math Figure 1]}$$

In Equation 1, 'C' is the capacitance, 'ε' is the dielectric constant, 'A' is the cross-sectional area of the button, and d is the distance between the button and the capacitive sensor. The dielectric layer 29 may include a dielectric material having a dielectric constant sufficient to change the capacitance to input a signal. At least a part of the dielectric layer 29 may be exposed to the outside.

For example, the dielectric layer 29 may be composed of an air layer. There may be an air positioned on the upper surface of the capacitive sensor 21. Since the air layer also has a specific dielectric constant, the air can serve as the dielectric layer 29.

At least one button 35 may be located on the dielectric layer 29. The at least one button 35 may be a place where the user's touch is made. The at least one button 35 may be made of the same material as the battery cover 203.

FIG. 5 is a rear plan view and a sectional view of a mobile terminal according to an embodiment of the present invention.

Referring to FIG. 5, the button 35 may be located near the center of the battery cover 203. The button 35 may include first, second, and third buttons 35a, 35b, and 35c. The first, second, and third buttons 35a, 35b, and 35c may include a plurality of holes. The plurality of holes may allow the user to easily recognize the touch position when the user touches the button 35. The first, second, and third buttons 35a, 35b, and 35c may be spaced apart from the camera module 221 by a certain distance. In particular, since the first, second, and third buttons 35a, 35b, and 35c are formed by a plurality of holes, if the spacing is too narrow, a malfunction may occur that touches another button. Accordingly, the spacing between the first, second, and third buttons 35a, 35b, and 35c may have greater than the spacing between the holes of the button. Each of the first, second, and third buttons 35a, 35b, and 35c may generate a touch event corresponding to each of the first, second, and third buttons 35a, 35b, and 35c.

The dielectric layer may be exposed to the outside at the plurality of holes of the first, second, and third buttons 35a, 35b, and 35c. The capacitance of the user's touch can be measured more easily due to the exposure of the dielectric layer. A method of measuring the capacitance will be described later.

FIG. 6 is a cross-sectional view illustrating states of the rear input module of an embodiment of the present invention before and after the touch is applied.

Referring to FIG. 6 (*a*), the spacing between the button 35 and the capacitive sensor 21 may be substantially constant before the user touches the button 35 of the rear input module 233. The spacing between the position where the button 35 is located and the capacitive sensor 21 and the spacing between the portion where the button 35 is not positioned and the electrostatic sensor 21 may be the same. The electrostatic capacitance transmitted to the electrostatic sensor 21 may be constant.

Referring to FIG. 6 (*b*), when the user touches the button 35 of the rear input module 233, the capacitance variation may occur. First of all, the capacitance between the user's body and the capacitive sensor 21 can be formed through at least one hole of the button 35. At least one hole of the button 35 may allow the user to grasp the position at which the capacitance is generated between the user's body and the electrostatic sensor 21 in detail.

If there is no hole at the button 35, the capacitance between the user's body and the capacitive sensor 21 can be measured for the same capacitance across the entire area of the battery cover due to the conductivity of the battery cover. Alternatively, in case that the hole is located at the button 35, the capacitance between the user's body and the capacitive sensor 21 can be generated in a portion where the hole is located. Thus, it is possible to grasp the position where the electrostatic capacitance is generated by the user's touch in detail.

In addition, the spacing between the button 35 and the capacitive sensor 21 may be varied by the pressure applied by the user to the button 35. In detail, the spacing between the region that the user touches among the whole region of the button 35 and the capacitive sensor 21, may be smaller than the spacing between the region that the user does not touch among the whole region of the button 35 and the capacitive sensor 21.

Accordingly, the capacitive sensor 21 can recognize two kinds of different electrostatic capacities. In detail, the capacitive sensor 21 can measure the electrostatic capacitance between the user's body and the electrostatic sensor 21 through at least one hole located at the button 35. The capacitive sensor 21 can measure the variation of the electrostatic capacitance between the rear input module 233 and the capacitive sensor 21. The electrostatic capacity between the user's body and the capacitive sensor 21 through the at least one hole located at the button 35 may be referred to as a first electrostatic capacity. The variation of the electrostatic capacitance between the rear input module 233 and the capacitive sensor 21 can be referred to as a second electrostatic capacity.

When both the first electrostatic capacitance and the second electrostatic capacitance are generated, a touch event may occur.

In case that a touch event occurs when the first capacitance is generated, a malfunction may occur even if the user grasps the mobile terminal in an inconspicuous space such as a pocket. In case that a touch event occurs only when the second capacitance is generated, a malfunction may occur because the position where the pressure due to the touch is not accurately detected. A touch event may occur when both the first capacitance and the second capacitance are generated in the mobile terminal according to the embodiment of the present invention, thereby preventing malfunction.

FIG. 7 is a circuit diagram showing a driving method of the rear input module according to an embodiment of the present invention.

Referring to FIG. 7, the electrostatic sensor 21 may include a plurality of sensor arrays. The electrostatic capacitance variation 314 between the user's body and the sensor array through at least one hole and the electrostatic capacitance variation 316 between the battery cover 203 and the sensor array can happen simultaneously at the sensor array that the user touches among the plurality of sensor arrays.

In this case, the driving IC can sense the capacitance change 314 between the user's body and the sensor array and the capacitance change 316 between the battery cover and the sensor array. The driving IC can convert the sensed capacitance variations 314 and 316 into a voltage using an analog-to-digital converter (ADC). If this voltage exceeds the threshold voltage, a touch event corresponding to the sensor array of the touched area may occur.

The threshold voltage may be the sum of the capacitance variation between the user's body and the sensor array and the capacitance variation between the battery cover and the sensor array when the spacing between the battery cover and the sensor array becomes narrower than a predetermined displacement. The threshold voltage may be related to the coverage of the user's touch on the holes of the button 35. The reference coverage of the user's touch on the holes of the button 35 in terms of the threshold voltage may be referred to as threshold coverage of the user's touch. The threshold voltage may be related to the pressure of the user's touch upon the rear input module (or battery cover). The reference pressure of the user's voltage in terms of the threshold voltage may be referred to as a threshold pressure of the user's touch. The threshold pressure may be related to a reference variation of the distance between the button and the sensor array. The reference variation of the distance between the button and the sensor array may be referred to as threshold variation of button which is corresponding to the threshold pressure. When the user's touch is equal to or more than the threshold coverage and the threshold pressure, a touch event may occur.

For example, if an area of $1\pi$ (mm2) or more among a plurality of holes is touched and variation of distance between the battery cover and the sensor array is several tens of micrometers or more due to pressure upon the button, a touch event may occur.

The voltage measured by each capacitance variation 314, 316 may not exceed the threshold voltage. Accordingly, when only one capacitance variation occurs, the touch event may not occur. Alternatively, in case that a capacitance variation 314 between the user's body and the sensor array through holes over the threshold coverage happens and a capacitance variation 316 between the battery cover and the sensor array due to a pressure over the threshold pressure happens, the touch event may occur.

A mobile terminal according to an embodiment of the present invention may generate a touch event when both capacitance variations 314 and 316 occur. Thus, it is possible to prevent a malfunction of a button that the user does not intend.

FIG. 8 is a cross-sectional view illustrating a rear input module according to another embodiment of the present invention.

Referring to FIG. 8, the rear input module according to an embodiment of the present invention may include a transparent member 43 in a plurality of holes. For example, the transparent member 43 may include any one of an optically clear adhesive (OCA) film, silicon, and a light-transmitting material other than a conductor.

Since the transparent member 43 is disposed in the plurality of holes of the rear input module 233, dust or foreign matter may not enter the holes. Accordingly, the mobile terminal can be protected from malfunction or failure. In addition, since the transparent member 43 is filled in the hole, the mobile terminal can be cleaner in appearance.

FIG. 9 is a rear plan view showing a mobile terminal according to an embodiment of the present invention.

Referring to FIG. 9, the mobile terminal 200 according to an embodiment of the present invention may include the first, second, and third buttons 35a, 35b, and 35c on the rear input module 233 of the battery cover 203. The first, second, and third buttons 35a, 35b, and 35c may be spaced apart from the camera module 221 by a certain distance.

The first, second and third buttons 35a, 35b and 35c can emit light under a certain condition. For example, the first, second, and third buttons 35a, 35b, and 35c may emit light when the mobile terminal 200 is powered on. The first, second, and third buttons 35a, 35b, and 35c can emit light to the outside through the transparent member 43.

Alternatively, only a part of the first, second, and third buttons 35a, 35b, and 35c may emit light. For example, when the mobile terminal 200 receives a communication, only the first and third buttons 35a and 35c may emit light.

The manner in which the first, second, and third buttons 35a, 35b, 35c emit light is not limited to the above-described embodiment, and can emit light in various ways.

The first, second, and third buttons 35a, 35b, and 35c may emit light when a specific event occurs. Thus, the user can more easily confirm that the event is in progress and feel that the appearance of the mobile terminal has been improved.

FIG. 10 is a rear enlarged plan view showing a rear input module according to another embodiment of the present invention.

Referring to FIG. 10, the first, second, and third buttons 35a, 35b, and 35c according to an embodiment of the present invention may be circular. The first, second, and third buttons 35a, 35b, and 35c may be any one shape of a quadrangle, a triangle, a pentagon, and a star.

The first, second, and third buttons 35a, 35b, and 35c may include first and second channels 324a and 324b, respectively. The first channel 324a may include at least one of the plurality of holes of the button 35 and the second channel 324b may include at least another hole of the plurality of holes. The second channel 324b may be spaced apart from the first channel 324a. The first channel 324a may be located within the button 35 and the second channel 324b may be located at the outer perimeter of the first channel 324a. For example, the first channel 324a may be annular, and the second channel 324b may be annular surrounding the first channel 324b.

In FIG. 10, in order to easily distinguish the first and second channels 324a and 324b, the shape of the boundary portion is shown, but the present invention is not limited thereto and only a plurality of holes may be disposed. The mobile terminal of the present invention may be apparently cleaner in that only a plurality of holes are located without displaying the boundary portion.

FIG. 11 is a diagram illustrating a method of operating a button.

Referring to FIG. 11 (a), when the user touches only the second channel 324b of the button 35, a signal lower than the threshold signal may be transmitted to the controller (see 180 in FIG. 1). That is, the measured voltage may be lower than the threshold voltage. In this case, the controller 180 recognizes the touch of the user as an unintended touch, so that the touch event may not occur.

Referring to FIG. 11 (b), when the user simultaneously touches the first channel 324a and the second channel 324b of the button 35, a signal higher than the threshold signal may be transmitted to the controller 180. That is, the measured voltage may be higher than the threshold voltage. In this case, the controller 180 recognizes the user's touch as an intended touch, and a touch event may occur. The voltage generated by the touch of the first channel 324a and the touch of the second channel 324b may exceed the threshold voltage. The first and second channels 324a and 324b must be touched to generate a touch event.

The touch event may occur when the first and second channels 324a and 324b are touched at the same time. Accordingly, the user can reduce the mistake of unintentionally touching the button 35.

FIG. 12 is a cross-sectional view illustrating a rear input module according to another embodiment of the present invention.

Referring to FIG. 12, when the first and second channels 324a and 324b are simultaneously touched and the spacing between the button 35 and the capacitive sensor 21 is narrowed by the user's touch, a touch event may occur.

In this case, all three capacitive variations must occur in the rear input module 233, so that a voltage exceeding the threshold voltage may be generated. As a result, the user may be less likely to touch unintentionally.

FIGS. 13 to 15 are rear plan views illustrating a mobile terminal according to another embodiment of the present invention.

Referring to FIG. 13 (a), the first and third buttons 35a and 35c of the mobile terminal 200 according to the present invention may be constituted by touch keys. Also, the first and third buttons 35a and 35c may include one channel.

Alternatively, the second button 35b may be configured as a push key. For example, the second button 35b may be a power button of the mobile terminal 200. The power button can be configured as a push key because it must prevent malfunctions.

The first and third buttons 35a and 35c, which are touch keys, can be comparted by the second button 35b, which is a push key, as a boundary. That is, the first and third buttons 35a and 35c may be respectively disposed on a side and the other side of the second button 35a, which is a push key. Accordingly, the user can easily recognize the positions of the first and third buttons 35a and 35c by touching only the second button 35b. Also, the first and third buttons 35a and 35c are spaced apart from each other and malfunctions such as touching at the same time may not easily occur.

Referring to FIG. 13 (b), the second button 35b may be located on the lateral surface of the mobile terminal 200, not on the rear surface thereof. For example, the second button 35b may be a power button. Since the second button 35b is located on the lateral side, the user can easily recognize the second button 35b and turn on/off the power of the terminal. The first and third buttons 35a and 35c may be sequentially spaced apart from the camera 221'. The first and third buttons 35a and 35c may be spaced apart from each other to prevent malfunction such as being touched at the same time.

Referring to FIG. 14 (a), the first and third buttons 35a and 35c may be constituted by a touch key, and the second button 35b may be constituted by a push key. The second button 35b may be a button that must be protected against malfunction. For example, the second button 35b may be a power button.

The first and third buttons 35a and 35c may include first and second channels 324a and 324b, respectively. Accordingly, the first and third buttons 35a and 35c can further reduce a mistake that the user unintentionally touches.

Referring to FIG. 14 (b), the second button 35b may be located on a lateral side of the mobile terminal 200. In this case, the user can easily recognize the second button 35b, which is an important button.

Since the first and third buttons 35a and 35c include the first and second channels 324a and 324c respectively, it is possible to prevent wrong touch even if the second button 35b is not positioned between the first and third buttons 35a and 35c.

The first and third buttons 35a and 35c may be composed of at least two channels. Accordingly, the unintentional touch of the user can be further prevented.

Referring to FIG. 15, the mobile terminal 200 may further include fourth to seventh buttons 35d-35g. The fourth to seventh buttons 35d-35g may be positioned between the first button 35a and the third button 35c. The fourth to seventh buttons 35d-35g may be relatively positioned upper, lower, left, and right. The fourth to seventh buttons 35d-35g may be in the form of a triangle having the center of the four buttons as a vertex.

For example, the fourth to seventh buttons 35d-35g may be used to implement a flicking gesture. A detailed operation of the flicking gesture will be described later.

Although the boundaries of the two channels of the first and third buttons 35a and 35c are clearly shown, the present invention is not limited thereto, and the boundary of the channel may not be appeared in order to have a neat appearance.

The mobile terminal 200 may further include fourth to seventh buttons 35d to 35g which are capable of flickering gestures on the rear surface. Accordingly, the user can input various commands using only one hand.

FIG. 16 is a rear plan view and a perspective view illustrating a mobile terminal according to another embodiment of the present invention.

Referring to FIG. 16, not only the rear input module 233 but also buttons located on the lateral side of the mobile terminal 200 may be configured with touch keys. However, an important button sensitive to malfunction such as the second button 35b may be constituted by a push key. For example, the second button 35b may be a power button.

The button located on the lateral side of the mobile terminal 200 according to the present invention may also be constituted by a touch key. Thus, users may feel cleaner because there are no apparently protruding parts.

FIGS. 17 to 33 are diagrams illustrating various embodiments of the present invention.

Referring to FIG. 17, when a user touches any one of the buttons 35 with a first touch 405, the controller 180 (see FIG. 1) may generate a specific control signal. In detail, the controller 180 may generate a control signal based on at least one of a moving speed, a moving direction, a touch intensity, a number of touches, and a duration time of the first touch. The first touch 405, for example, may be one of a short touch and a long touch.

For example, when the user touches the third button 35c by the first touch 405, the control unit 180 may start recording. The mobile terminal 200 may stop the application being executed and may start recording.

When the user touches the third button 35c by the second touch 407, the controller 180 may stop recording and can execute the application that has been stopped. The second touch 407 may be one of a short touch and a long touch.

The mobile terminal 200 according to the present invention can start or stop recording by a simple touch. Accordingly, the user can conveniently operate the mobile terminal 200 with only one hand.

Referring to FIG. 18, when the user touches any one of the buttons 35, the controller 180 may generate a specific control signal. The first touch 405, for example, may be either a short touch or a long touch.

For example, when the user operates the third button 35c while the camera application is operating, the controller 180 may focus on the subject.

Next, when the user touches the third button 35c by the second touch 407, the controller 180 can take a picture. The second touch 407 may be a touch different from the first touch 405. Specifically, if the first touch 405 is a short touch, the second touch 407 may be a long touch, and if the first touch 405 is a long touch, the second touch 407 may be a short touch.

The mobile terminal 200 can focus the subject and take a picture, with two simple touches. Accordingly, the user can conveniently take a picture with only two touches.

Referring to FIG. 19, when the user touches any one of the buttons 35 with the first and second touches 405 and 407, the controller 180 may generate a specific control signal. The first and second touches 405 and 407 may occur continuously. The first touch 405 and the second touch 407 may be different touches. In case that the first touch 405 is a short touch, the second touch 407 may be a long touch. In case that the first touch 405 is a long touch, the second touch 407 may be a short touch.

For example, when the user touches the third button 35 by first and the second touches 405 and 407, the control unit 180 can capture the screen displayed on the display unit 251.

The mobile terminal 200 can capture a screen with two consecutive touches. Accordingly, the user can easily capture a screen by performing a simple continuous click with one hand.

Referring to FIG. 20, when the user repeats the first touch 405 a plurality of times on any one of the buttons 35, the controller 180 may generate a specific control signal. The first touch 405 may be either a short touch or a long touch.

For example, if the user repeats the first touch 405 three times on the third button 35c, the controller 180 can convert a mode of the mobile terminal 200 into the vibration mode.

Next, when the user repeats the first touch 405 three times on the third button 35c, the controller 180 can convert the mode of the mobile terminal 200 into the silent mode.

The mode of the mobile terminal 200 can be changed into a vibration mode or a silent mode by touches repeated a plurality of times. Accordingly, the user can change the setting of the mobile terminal 200 only by repeating a simple touch.

Referring to FIG. 21, when the user performs the first gesture 504 flicking at least two of the buttons 35, the controller 180 may generate a specific control signal. The first gesture 504 may be a gesture flicking from left to right or a gesture flicking from top to bottom.

For example, when the user makes the first gesture 504 flicking from the fourth button 35d to the fifth button 35e, the controller 180 can perform an operation of turning a page of the e-book backward.

Referring to FIG. 22, when the user makes a second gesture 506 flicking at least two of the buttons 35, the controller 180 may generate a specific control signal. The second gesture 506 may be a gesture flicking in a direction opposite to the first gesture 504. That is, the second gesture 506 may be a gesture flicking from right to left, or a gesture flicking from bottom to top.

For example, if the user makes a second gesture 506 flicking from the fifth button 35e to the fourth button 35d, the controller 180 may perform an operation of turning a page of the e-book forward.

The mobile terminal 200 according to the present invention can turn a page of an e-book with a simple flicking gesture. As a result, users can easily read e-books.

Referring to FIGS. 23 and 24, when the user performs the first and second gestures 504 and 506 that flick at least two of the buttons 35, the controller 180 may generate a specific control signal. The first gesture 504 may be a gesture flicking from left to right or a gesture flicking from top to bottom. The second gesture 506 may be a gesture flicking in a direction opposite to the first gesture 504. That is, the second gesture 506 may be a gesture flicking from right to left, or a gesture flicking from bottom to top.

For example, when the user makes a first gesture 504 flicking from the sixth button 35f to the seventh button 35g during a phone call, the volume of sound may be reduced. Also, when the user makes a second gesture 506 that flicking from the seventh button 35g to the sixth button 35f during a call, the volume of sound may increase.

The mobile terminal 200 can adjust the sound volume during a phone call with a simple flicking gesture. Accordingly, the user can easily adjust the sound volume to a proper level during a call without complicated operations.

Referring to FIGS. 25 and 26, when the user uses first and second gestures 504 and 506 that flick at least two of the buttons 35, the controller 180 may generate a specific control signal. The first gesture 504 may be a gesture flicking from left to right or a gesture flicking from top to bottom. The second gesture 506 may be a gesture flicking in a direction opposite to the first gesture 504. That is, the second gesture 506 may be a gesture flicking from right to left, or a gesture flicking from bottom to top.

For example, when the user performs the first gesture 504 flicking from the sixth button 35f to the seventh button 35g, the screen may become dark. Further, when the user performs the second gesture 506 flicking from the seventh button 35g to the sixth button 35f, the sound volume of the phone call can be increased.

The mobile terminal 200 can adjust the brightness of the screen with a simple flicking gesture. Accordingly, users can easily change the brightness of the screen of the mobile terminal 200 with one hand.

Referring to FIGS. 27 and 28, when the user performs the first and second gestures 504 and 506 that flick at least two of the buttons 35, the controller 180 may generate a specific control signal. The first gesture 504 may be a left-to-right flicking shirt or a top-down flicking gesture. The second gesture 506 may be a gesture flicking in a direction opposite to the first gesture 504. That is, the second gesture 506 may be a gesture flicking from right to left, or a gesture flicking from bottom to top.

For example, the size of the screen of the mobile terminal 200 may be reduced when the user makes a first gesture 504 flicking from the sixth button 35f to the seventh button 35g during photographing. Also, when the user makes a second gesture 506 that flicking from the seventh button 35g to the sixth button 35f during photographing, the screen may be enlarged. For example, the focal length of the mobile terminal 200 may be reduced when the user makes a first gesture 504 flicking from the sixth button 35f to the seventh button 35g during photographing. Also, when the user makes a second gesture 506 that flicking from the seventh button 35g to the sixth button 35f during photographing, the focal length of the mobile terminal 200 may be lengthened.

The mobile terminal 200 can enlarge or reduce a photograph with a simple flicking gesture. As a result, users can shoot pictures in a size that they can more easily enjoy.

Referring to FIGS. 29 and 30, when the user performs the first and second gestures 504 and 506 flicking at least two of the buttons 35, the controller 180 may generate a specific control signal. The first gesture 504 may be a gesture flicking from left to right or a gesture flicking from top to bottom. The second gesture 506 may be a gesture flicking in a direction opposite to the first gesture 504. The second gesture 506 may be a gesture flicking from right to left or a gesture flicking from bottom to top.

For example, when the user performs the first gesture 504 flicking from the fourth button 35d to the fifth button 35e during photographing, the photographing screen may be brightened. When the user performs the second gesture 506 flicking from the fifth button 35e to the fourth button 35d during photographing, the photographing screen may become dark.

The mobile terminal 200 can adjust brightness of the screen during photographing with a simple flicking gesture. Accordingly, users can more easily obtain an image having a brightness desired.

Referring to FIG. 31 (a), the user generally grips the lower portion of the mobile terminal 200 and touches the button 35 with the index finger. The third button 35c is located below the first button 35a. Accordingly, the third button 35c can be accurately touched.

Referring to FIG. 31 (b), when the first button 35a is touched, the third button 35c and the first button 35a are likely to be touched simultaneously.

Referring to FIG. 32, when the first button 35a and the third button 35c are touched simultaneously, the controller 180 can generate a control signal which is originally configured to be generated when only the first button 35a is touched. For example, when the user touches the first button 35a and the third button 35c at the same time during a phone call, the sound volume of the phone call may become larger as when the first button 35a is touched.

The mobile terminal 200 can generate a desired signal even if two buttons are touched simultaneously. Accordingly, the user can freely touch the rear button without fear of malfunction.

Referring to FIG. 33, at least one button 35 of the mobile terminal 200 may be configured as a touch button. Accordingly, it is easy for the user to make an unintended touch.

The user's body is touched on at least one button 35 of the mobile terminal, but the button may not yet be pressurized. In this case, the controller 180 may generate a specific control signal to prevent unintentional touch of the user.

For example, when the user touches at least one button 35 but no pressure is applied onto the button 35, the controller 180 may cause the vibration to be vibrated. When the mobile terminal 200 vibrates, the user can recognize the unintended touch and may stop the touch of the body on the button 35.

The controller 180 of the mobile terminal 200 can generate a signal for alarming the user when an intended touch occurs. Accordingly, the user can further prevent a malfunction when touching the screen.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A mobile terminal comprising:
a case having an inner space, a metal surface and a plurality of holes formed on the metal surface, the plurality of holes communicating with an outside of the case and the inner space;
a capacitive sensor positioned in the case, spaced apart from the metal surface, and facing the plurality of holes, the capacitive sensor acquiring a variation of an electrostatic capacitance; and
a controller generating a control signal,
wherein the plurality of holes acquires a touch input of a user,
wherein the electrostatic capacitance includes:
a first electrostatic capacitance generated between the user and the capacitive sensor through the plurality of holes; and
a second electrostatic capacitance generated between the metal surface and the capacitive sensor,
wherein the controller generates a control signal when the capacitive sensor acquires a variation of the first electrostatic capacitance and a variation of the second electrostatic capacitance, and
wherein the mobile terminal further comprises:
an input module installed at the case and a button having the plurality of holes, the input module acquiring the touch input of the user.

2. The mobile terminal of claim 1, further comprising a dielectric layer positioned between the metal surface and the capacitive sensor.

3. The mobile terminal of claim 1, wherein the capacitive sensor acquires the variation of the first electrostatic capacitance in accordance with the touch input in the plurality of holes.

4. The mobile terminal of claim 3, wherein the metal surface comprises a region adjacent to the plurality of holes, and
wherein the capacitive sensor acquires the variation of the second electrostatic capacitance according to a distance variation between the region and the capacitive sensor.

5. The mobile terminal of claim 1, wherein the capacitive sensor transforms the electrostatic capacitance into a voltage, and
wherein the capacitive sensor acquires the variation of the electrostatic capacitance when the capacitive sensor measures the voltage.

6. The mobile terminal of claim 1, wherein the input module is located on a rear surface of the case.

7. The mobile terminal of claim 1, wherein the case includes a metal.

8. The mobile terminal of claim 1, wherein at least a portion of the plurality of holes is filled with a first member, and
wherein a substance of the first member is different from a substance of the case.

9. The mobile terminal of claim 8, wherein the first member is dielectric.

10. The mobile terminal of claim 8, wherein the first member is transparent.

11. The mobile terminal of claim 10, wherein the button includes a plurality of buttons, and
wherein at least one of the plurality of buttons emits light through the first member.

12. The mobile terminal of claim 1, wherein the button includes:
a first channel forming at least one hole among the plurality of holes; and
a second channel forming at least another hole among the plurality of holes, the second channel spaced apart from the first channel.

13. The mobile terminal of claim 12, wherein the second channel is located at an outer circumference of the first channel.

14. The mobile terminal of claim 12, wherein the controller generates the control signal when the touch input is applied on both the first and second channels.

15. The mobile terminal of claim 1, further comprising a push key acquiring an input from the user,
wherein the button includes a first button and a second button, and
wherein the push key is positioned between the first button and the second button.

16. The mobile terminal of claim 1, wherein the controller generates the control signal based on at least one of a moving speed of the touch input, an intensity of the touch input, a number of touches of the touch input, and a duration time of the touch input.

17. The mobile terminal of claim 1, wherein the capacitive sensor includes a plurality of sensor arrays electrically insulated from each other.

18. The mobile terminal of claim 1, wherein the control signal includes at least one of a signal for a voice recording, a signal for stopping the voice recording, a signal for photographing, a signal for focusing a picture, a signal for capturing a screen, a signal for converting into a silent mode, and a signal for converting into a vibration mode.

* * * * *